United States Patent
Okada et al.

(10) Patent No.: US 12,021,086 B2
(45) Date of Patent: Jun. 25, 2024

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Kuniaki Okada, Kameyama (JP); Shinpei Higashida, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/238,124

(22) Filed: Aug. 25, 2023

(65) Prior Publication Data

US 2024/0105731 A1    Mar. 28, 2024

(30) Foreign Application Priority Data

Sep. 22, 2022   (JP) ................... 2022-151728

(51) Int. Cl.
   *H01L 27/12*   (2006.01)
   *G02F 1/1362*  (2006.01)
   *G02B 27/01*   (2006.01)

(52) U.S. Cl.
   CPC .... *H01L 27/1218* (2013.01); *G02F 1/136286* (2013.01); *G02B 27/0172* (2013.01)

(58) Field of Classification Search
   CPC ........... H01L 27/1218; G02F 1/136286; G02B 27/0172
   See application file for complete search history.

(56) References Cited

U.S. PATENT DOCUMENTS

| | | |
|---|---|---|
| 2013/0320334 A1 | 12/2013 | Yamazaki et al. |
| 2017/0033229 A1 | 2/2017 | Yamazaki et al. |
| 2017/0170200 A1 | 6/2017 | Ikeda et al. |
| 2017/0309751 A1 | 10/2017 | Yamazaki et al. |
| 2017/0358682 A1* | 12/2017 | Goto ................. H01L 29/42384 |
| 2017/0371190 A1* | 12/2017 | Yamazaki ......... G02F 1/133305 |
| 2018/0190679 A1* | 7/2018 | Inoue .................. H01L 27/1244 |
| 2020/0185420 A1 | 6/2020 | Ikeda et al. |
| 2023/0079181 A1 | 3/2023 | Keda et al. |

FOREIGN PATENT DOCUMENTS

| | | |
|---|---|---|
| JP | 2014-007399 A | 1/2014 |
| JP | 2017-167515 A | 9/2017 |

* cited by examiner

*Primary Examiner* — Kevin Quarterman
(74) *Attorney, Agent, or Firm* — ScienBiziP, P.C.

(57) ABSTRACT

An active matrix substrate includes a substrate and a plurality of pixels located on the substrate. Each of the pixels includes an oxide semiconductor layer, a first insulator covering the oxide semiconductor layer, a first contact hole located at the first insulator, a first extraction electrode located on the first insulator and in the first contact hole, and connected to the oxide semiconductor layer, a second insulator covering the first extraction electrode, a second contact hole located at the second insulator, a second extraction electrode located on the second insulator and in the second contact hole, and connected to the first extraction electrode, and a pixel electrode connected to the second extraction electrode. The first and second extraction electrodes are light-transmissive, and a portion of a side surface of at least one of the first and second contact holes is not covered with the first and second extraction electrodes.

10 Claims, 22 Drawing Sheets

ACTIVE MATRIX SUBSTRATE AND LIQUID CRYSTAL DISPLAY DEVICE

CROSS-REFERENCE TO RELATED APPLICATIONS

This application claims the benefit of priority to Japanese Patent Application Number 2022-151728 filed on Sep. 22, 2022. The entire contents of the above-identified application are hereby incorporated by reference.

BACKGROUND

Technical Field

The disclosure relates to an active matrix substrate and a liquid crystal display device.

Display devices, such as a liquid crystal display device and an organic electroluminescence (EL) display device, are used in various image display devices, and are also used in a head-mounted display, for example. Since the head-mounted display is generally disposed immediately in front of the eyes, in the same manner as with glasses, the distance between the display device and the eyes is short, and the display device is required to have a very high resolution (1000 ppi or higher, for example).

Since the head-mounted display is worn on the head, it is preferable that the head-mounted display be driven by an internal power source. For this reason, it is preferable to use, as a thin film transistor (TFT) for driving a pixel, a TFT including an oxide semiconductor layer excellent in low leakage performance. For example, JP 2017-167515 A discloses such a liquid crystal display device.

SUMMARY

With head-mounted displays, there is demand for further improvement in display quality. Specifically, there is demand for display with higher contrast. An object of the disclosure is to provide an active matrix substrate and a liquid crystal display device that can perform display with higher contrast.

An active matrix substrate according to an embodiment of the disclosure includes a substrate including a display region, a plurality of source bus lines extending in a first direction at the display region, a plurality of gate bus lines extending in a second direction intersecting the first direction, and a plurality of pixels located on the display region of the substrate, each of the plurality of pixels being electrically connected to one of the plurality of source bus lines and one of the plurality of gate bus lines. Each of the plurality of pixels includes an oxide semiconductor layer located on the substrate and partially overlapping the one of the plurality of gate bus lines in a plan view, a first insulator covering the oxide semiconductor layer, a first contact hole located at the first insulator and configured to expose a portion of the oxide semiconductor layer, a first extraction electrode located on the first insulator and in at least a portion of the first contact hole, and connected to the oxide semiconductor layer, a second insulator covering the first extraction electrode, a second contact hole located at the second insulator and configured to expose a portion of the first extraction electrode, a second extraction electrode located on the second insulator and in at least a portion of the second contact hole, and connected to the first extraction electrode, and a pixel electrode located on the second insulator and connected to the second extraction electrode. The first extraction electrode and the second extraction electrode are light-transmissive, and a portion of a side surface of at least one of the first contact hole and the second contact hole is not covered with the first extraction electrode and the second extraction electrode.

According to an embodiment of the disclosure, an active matrix substrate and a liquid crystal display device that can perform display with higher contrast are provided.

BRIEF DESCRIPTION OF DRAWINGS

The disclosure will be described with reference to the accompanying drawings, wherein like numbers reference like elements.

DESCRIPTION OF EMBODIMENTS

Figure 1:
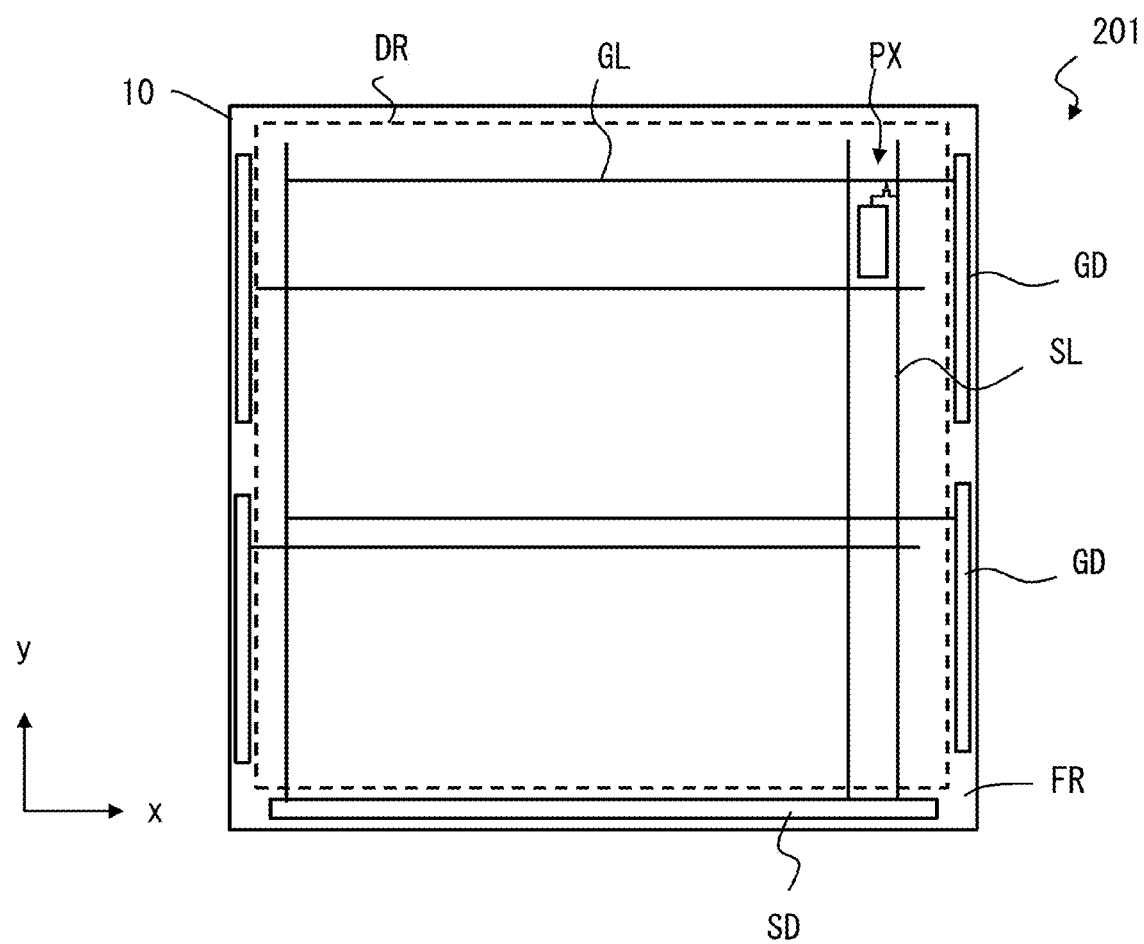
FIG. 1 is a schematic diagram illustrating an example of a planar structure of an active matrix substrate according to a first embodiment.

For example, when realizing a liquid crystal display device having an ultra high resolution of 1000 ppi or higher, as the size of each pixel becomes small, it is preferable to increase the aperture ratio in order to increase the luminance of white display. For example, it is conceivable that a pixel electrode and an oxide semiconductor layer are connected to each other by a transparent extraction electrode via a contact hole, by utilizing the fact that the oxide semiconductor is transparent.

However, when the inventors of the present application examined the display quality of a liquid crystal display device having such a structure, it has been found that light leakage occurs in the contact hole during black display, and the luminance of black display does not become sufficiently low. As will be described in detail below, the black display in the liquid crystal display device is realized by a polarized light transmitted through a liquid crystal layer, being blocked by a transmission axis (polarization axis) of a polarizer located on the side of an observer. However, in a liquid crystal display device having a structure in which the polarized light is transmitted through a contact hole, it is conceivable that the polarization direction of the transmitted polarized light is rotated due to the shape of the contact hole.

In light of the problem described above, the inventors of the present application have conceived an active matrix substrate having a novel structure. Embodiments of the disclosure will be described below with reference to the drawings. The disclosure is not limited to the following embodiments, and appropriate design changes can be made within a scope that satisfies the configuration of the disclosure. Further, in the description below, the same reference signs may be used in common among the different drawings for the same portions or portions having the same or similar functions, and descriptions of repetitions thereof may be omitted. Further, the configurations described in the embodiments and modified examples may be combined or modified as appropriate within a range that does not depart from the gist of the disclosure. For ease of explanation, in the drawings referenced below, the configurations may be simplified or schematically illustrated, or some components may be omitted. Further, dimensional ratios between the components illustrated in the drawings are not necessarily indicative of actual dimensional ratios. Terms "orthogonal" and "parallel" are not limited to a case where sides or surfaces are arranged so as to have a relationship of exactly 900 or 1800 with respect to each other, but include a case where two sides, two surfaces, or a side and a surface are arranged within a range of allowable error (about ±3, for example), that is, for example, within ranges of 870 to 930 and 1770 to 183°, respectively.

First Embodiment

FIG. 1 is a schematic diagram illustrating an example of a planar structure of an active matrix substrate 201 according to this embodiment. The active matrix substrate 201 includes a substrate 10 that includes, on a main surface thereof, a display region DR, and a non-display region FR that is a region other than the display region DR. The display region DR includes a plurality of pixels PX arrayed in a matrix shape in an x direction (second direction) and a y direction (first direction) orthogonal to the x direction. The non-display region FR is a region positioned in the periphery of the display region DR, and does not contribute to display.

The active matrix substrate 201 includes a plurality of source bus lines SL and a plurality of gate bus lines GL in the display region DR. For example, the plurality of source bus lines SL extend in the y direction, and the plurality of gate bus lines GL extend in the x direction.

Figure 2:
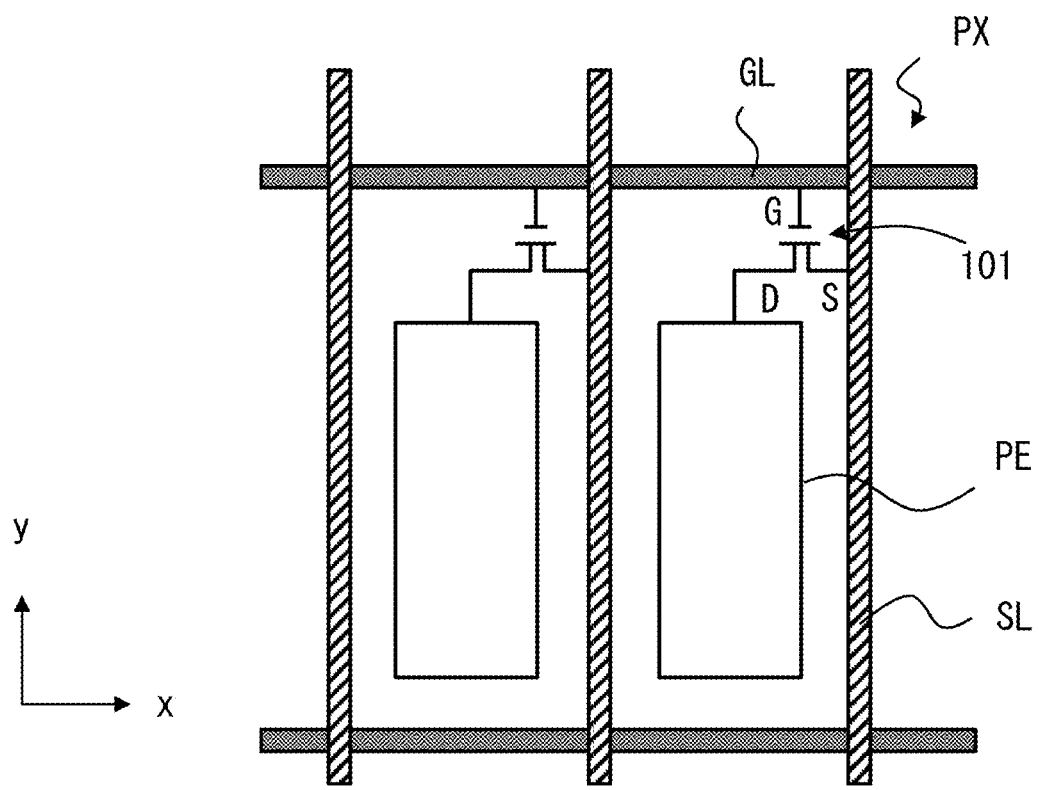
FIG. 2 is a schematic diagram illustrating a planar structure of a pixel of the active matrix substrate according to the first embodiment in an enlarged manner.

Each of the pixels PX includes a pixel TFT 101 and a pixel electrode PE. FIG. 2 is a schematic diagram illustrating a planar structure of the pixel PX of the active matrix substrate 201 in an enlarged manner. As illustrated in FIG. 2, each of the pixels PX is connected to one of the plurality of gate bus lines GL and one of the plurality of source bus lines SL. More specifically, a gate G of the pixel TFT 101 is connected to the gate bus line GL, and a source S of the pixel TFT 101 is connected to the source bus line SL. Further, a drain D is electrically connected to the pixel electrode PE.

As illustrated in FIG. 1, the active matrix substrate 201 further includes a drive circuit located in the non-display region FR of the substrate 10 and including gate drivers GD and a source driver SD.

As described above, for example, when the active matrix substrate 201 is used in a display device for a head-mounted display, it is preferable that the TFT for driving the pixel include an oxide semiconductor layer excellent in low leakage performance. On the other hand, it is preferable that the drive circuit be constituted by a TFT having a large drive current. For example, the drive circuit preferably includes a plurality of TFTs each including a low-temperature polysilicon (polycrystalline silicon) semiconductor layer.

Figure 3:
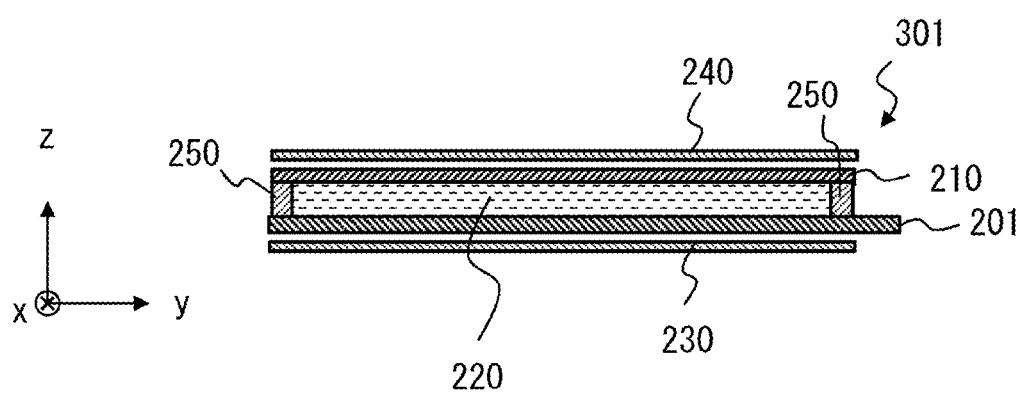
FIG. 3 is a schematic cross-sectional view illustrating a configuration example of a case where the active matrix substrate according to the first embodiment is applied to a liquid crystal display device.

FIG. 3 is a schematic cross-sectional view illustrating a configuration example of a liquid crystal display device 301 according to this embodiment. The liquid crystal display device 301 includes the active matrix substrate 201, a counter substrate 210, a liquid crystal layer 220, a polarizer 230, and a polarizer 240.

The counter substrate 210 is disposed with a predetermined gap from the main surface of the active matrix substrate 201 by a spacer 250, and the liquid crystal layer 220 is sandwiched between the active matrix substrate 201 and the counter substrate 210. The polarizer 230 and the polarizer 240 face each other with at least the liquid crystal layer 220 interposed therebetween. More specifically, the polarizer 230 and the polarizer 240 are positioned so as to sandwich the counter substrate 210, the liquid crystal layer 220, and the active matrix substrate 201.

A pair of the polarizers 230 and 240 are disposed in a crossed-Nicol manner. For example, the transmission axis (polarization axis) of the polarizer 230 is parallel to the y direction, and the transmission axis (polarization axis) of the polarizer 240 is parallel to the x direction. The transmission axis of the polarizer 230 may be parallel to the x direction, and the transmission axis of the polarizer 240 may be parallel to the y direction. Thus, linearly polarized light transmitted through the polarizer 230 is incident on the active matrix substrate 201.

Figure 4:
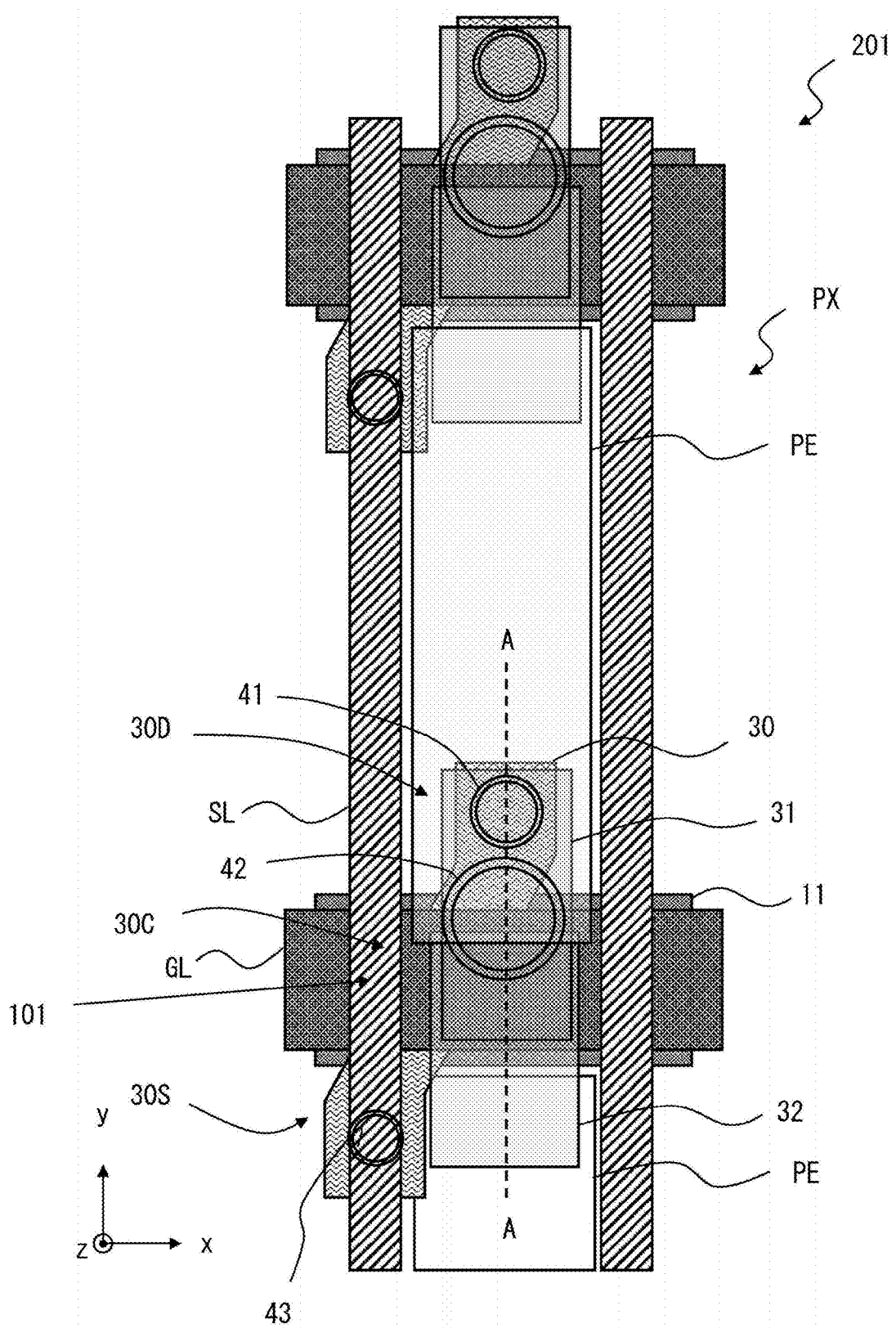
FIG. 4 is a plan view illustrating a structure of each of the pixels of the active matrix substrate according to the first embodiment.
Figure 5:
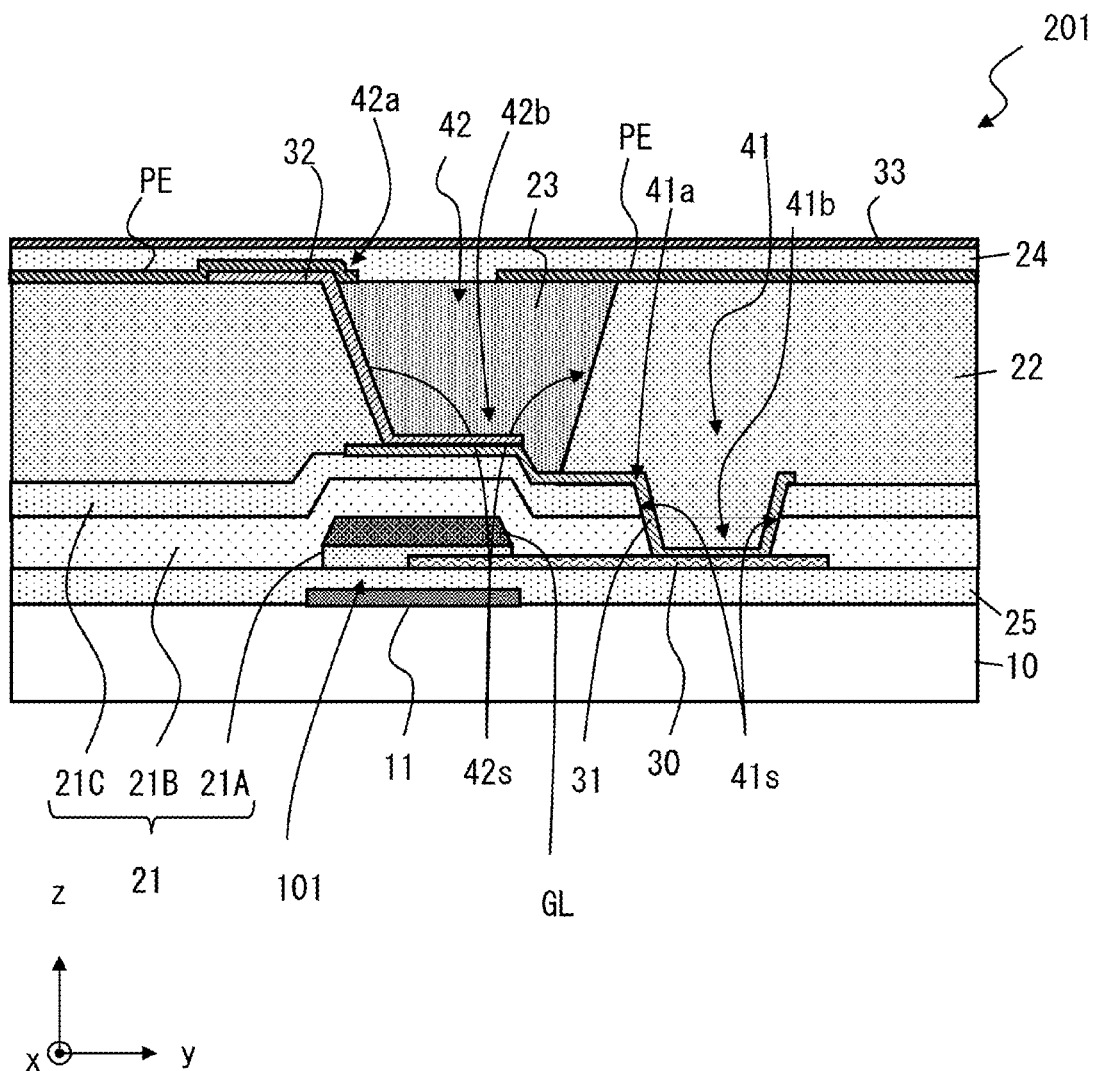
FIG. 5 is a schematic view illustrating a structure of the active matrix substrate at a cross section taken along a line A-A in FIG. 4.

FIG. 4 is a plan view illustrating main constituent elements of the pixel PX of the active matrix substrate 201, and FIG. 5 illustrates a structure of the active matrix substrate 201 at a cross section taken along a line A-A in FIG. 4. In FIG. 4, in order to clearly illustrate how the constituent elements overlap one another, some of the constituent elements are illustrated so that the underlying structure thereof is visible. Further, in FIG. 4, a common electrode and various insulating layers, which will be described later, are not illustrated.

The pixel PX of the active matrix substrate 201 includes, in addition to the pixel TFT 101 and the pixel electrodes PE described above, a light blocking layer 11, an underlayer 25, a first insulator 21, a second insulator 22, a third insulator 23, a dielectric 24, a first extraction electrode 31, a second extraction electrode 32, and a common electrode 33. Further, the pixel TFT 101 includes an oxide semiconductor layer 30, and a gate electrode that is a part of the gate bus lines GL.

The substrate 10 is, for example, a light-transmissive glass substrate. In the specification of the present application, the term "light-transmissive" means allowing at least light in a wavelength band of visible light to pass through.

The light blocking layer 11 is disposed on the substrate 10 so as to overlap at least the gate bus line GL in a plan view. In the specification of the present application, the plan view refers to a view from a direction perpendicular to the substrate 10.

The underlayer 25 is disposed on the substrate 10 so as to cover the light blocking layer 11. The underlayer 25 has insulating properties, and is made of, for example, an inorganic material such as silicon oxide and silicon nitride.

As illustrated in FIG. 4, the oxide semiconductor layer 30 is disposed so as to intersect the gate bus line GL in a plan view. The oxide semiconductor layer 30 includes a channel region 30C, a source region 30S, and a drain region 30D. The channel region 30C is located at the light blocking layer 11. On the other hand, each of the source region 30S and the drain region 30D is adjacent to the channel region 30C.

The oxide semiconductor layer 30 may be an amorphous oxide semiconductor, or a crystalline oxide semiconductor having a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer 30 may be a single layer, or may have a layered structure including two or more layers. When the oxide semiconductor layer 30 has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. When the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer. The oxide semiconductor layer is described in detail in JP 2014-007399 A, for example.

The oxide semiconductor layer may include, for example, at least one metal element selected from In, Ga, and Zn. In this embodiment, the oxide semiconductor layer includes, for example, an In—Ga—Zn—O-based semiconductor (for example, an indium gallium zinc oxide). Here, the In—Ga—Zn—O based semiconductor is a ternary oxide of In, Ga, and Zn, and a composition ratio of In, Ga, and Zn is not particularly limited. For example, the composition ratio may be In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O-based semiconductor.

In place of the In—Ga—Zn—O-based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn, and Zn. Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

The source region 30S and the drain region 30D have electrical conductivity. For example, the source region 30S and the drain region 30D may be formed by reducing the resistance of the oxide semiconductor layer 30, by irradiating the oxide semiconductor layer 30 with laser light, using the gate bus line GL or the light blocking layer 11 as a mask. Alternatively, the source region 30S and the drain region 30D may be formed by performing argon plasma treatment on the oxide semiconductor layer 30, or the source region 30S and the drain region 30D may be formed by forming an Al film on the oxide semiconductor layer 30 and causing a reaction.

The first insulator 21 having a film-like shape is disposed on the underlayer 25 so as to cover the oxide semiconductor layer 30. In this embodiment, the first insulator 21 includes a gate insulating layer 21A, a first inorganic insulating layer 21B, and a second inorganic insulating layer 21C. The gate insulating layer 21A is disposed on the underlayer 25 so as to cover a portion of the oxide semiconductor layer 30, and below the gate bus line GL. The gate insulating layer 21A is made of, for example, silicon oxide, and formed, for example, by dry etching using the gate bus line GL as a mask.

The gate bus line GL is located on the gate insulating layer 21A. Further, the first inorganic insulating layer 21B is disposed on a gate insulating layer 27 so as to cover the gate bus line GL. The first inorganic insulating layer 21B is made of, for example, a silicon nitride film.

The source bus line SL is located on the first inorganic insulating layer 21B. The source bus line SL overlaps the oxide semiconductor layer 30 in a plan view, and the source bus line SL and the source region 30S of the oxide semiconductor layer 30 are connected to each other via a contact hole 43 provided at the first inorganic insulating layer 21B.

The second inorganic insulating layer 21C is located on the first inorganic insulating layer 21B so as to cover the source bus line SL. The second inorganic insulating layer 21C is made of, for example, silicon oxide.

The first insulator 21 is provided with a first contact hole 41 penetrating through the first insulator 21 in the thickness direction. The first contact hole 41 exposes a portion of the oxide semiconductor layer 30 at a bottom portion 41b. Specifically, the first contact hole 41 has a reverse-tapered shape in which the bottom portion 41b is smaller than an opening 41a. In this embodiment, the opening 41a and the bottom portion 41b each have a substantially circular shape.

The first extraction electrode 31 is located on the first insulator 21 and in at least a portion of the first contact hole 41. In the first contact hole 41, the first extraction electrode 31 is connected to the oxide semiconductor layer 30. In this embodiment, the first extraction electrode 31 is located over an entire side surface 41s and the entire bottom portion 41b of the first contact hole 41. The first extraction electrode 31 is made of a transparent conductor such as ITO or IZO.

The second insulator 22 is located on the first insulator 21 so as to cover the first extraction electrode 31. The second insulator 22 is further disposed inside the first contact hole 41. The second insulator 22 is a flattening film that levels irregularities on the surface of the first insulator 21, and the upper surface of the second insulator 22 is substantially flat. The second insulator 22 is made of, for example, an organic insulator such as a photosensitive acrylic resin.

The second insulator 22 is provided with a second contact hole 42 penetrating through the second insulator 22 in the thickness direction. The second contact hole 42 exposes a portion of the first extraction electrode 31 at a bottom portion 42b. Specifically, the second contact hole 42 has a reverse-tapered shape in which the bottom portion 42b is smaller than an opening 42a. In this embodiment, the opening 42a and the bottom portion 42b each have a substantially circular shape.

In a plan view, a portion of the second contact hole 42 overlaps the gate bus line GL and the light blocking layer 11, and the remaining portion thereof does not overlap the gate bus line GL and the light blocking layer 11. Further, the second contact hole 42 entirely overlaps the first extraction electrode 31 in a plan view.

The second extraction electrode 32 is located on the second insulator 22 and in at least a portion of the second contact hole 42. In the second contact hole 42, the second extraction electrode 32 is connected to the first extraction electrode 31. In this embodiment, the second extraction electrode 32 covers only a portion of a side surface 42s of the second contact hole 42, and do not cover the remaining portion of the side surface 42s. More specifically, the second extraction electrode 32 is located at a portion, of the side surface 42s of the second contact hole 42, overlapping the gate bus line GL and the light blocking layer 11 in a plan view, and the second extraction electrode 32 is not located at a portion, of the side surface 42s, not overlapping the gate bus line GL and the light blocking layer 11. Thus, the second insulator 22 is exposed at the portion, of the side surface 42s, not overlapping the gate bus line GL and the light blocking layer 11.

In a mode illustrated in FIG. 5, similarly with the bottom portion 42b of the second contact hole 42, the second extraction electrode 32 is located at a portion, of the bottom portion 42b of the second contact hole 42, overlapping the gate bus line GL and the light blocking layer 11, and the second extraction electrode 32 is not located at a portion, of the bottom portion 42b, not overlapping the gate bus line GL and the light blocking layer 11. However, the second extraction electrode 32 may cover the entire bottom portion 42b. The second extraction electrode 32 is also made of a transparent conductor such as ITO or IZO. When the first extraction electrode 31 and the second extraction electrode 32 are made of the same material, a case may occur where a portion of the first extraction electrode 31 is also removed during etching of the second extraction electrode 32. In order to prevent this, different materials or different etching solutions may be used for the first extraction electrode 31 and the second extraction electrode 32. When forming the second extraction electrode 32, a combination is selected that does not affect the first extraction electrode 31.

The third insulator 23 is located in the second contact hole 42. More specifically, the third insulator 23 covers the second extraction electrode 32 disposed in the second contact hole 42, and levels a recess formed by the second contact hole 42. The upper surface of the third insulator 23 and the upper surface of the second insulator 22 are located at the same height.

As described above, since the side surface 42s and the bottom portion 42b of the second contact hole 42 are partially covered with the second extraction electrode 32, the third insulator 23 includes, in the second contact hole 42, a portion in contact with the second extraction electrode 32 and a portion in contact with the first insulator 21 or the first extraction electrode 31.

Specifically, of the third insulator 23, a portion overlapping the gate bus line GL and the light blocking layer 11 in a plan view is in contact with the second extraction electrode 32. Further, of the third insulator 23, a portion not overlapping the gate bus line GL and the light blocking layer 11 in a plan view is in contact with the second insulator 22 at the side surface 42s and in contact with the second extraction electrode 32 at the bottom portion 42b.

The third insulator 23 is made of, for example, an organic insulator such as a photosensitive acrylic resin. The material constituting the second insulator 22 and the material constituting the third insulator 23 preferably have substantially the same refractive indices, and more preferably have the same refractive index. For example, the third insulator 23 is made of the same material as the material constituting the second insulator 22.

The pixel electrode PE is located at least on the second insulator 22, and is connected to the second extraction electrode 32. In this embodiment, the pixel electrode PE is also located on the third insulator 23 in the second contact hole 42. Further, by the pixel electrode PE being located on a portion of the second extraction electrode 32 located on the second insulator 22, the pixel electrode PE and the second extraction electrode 32 are connected to each other. The pixel electrode PE is made of, for example, a transparent conductor such as ITO.

As illustrated in FIG. 4 and FIG. 5, the pixel electrode PE is disposed in a region surrounded by a pair of the source bus lines SL and a pair of the gate bus lines GL. The pixel electrode PE illustrated on the right side in FIG. 5 is the pixel electrode of the adjacent pixel PX. In this embodiment, the oxide semiconductor layer 30 of the TFT 101 intersects the gate bus line GL in a plan view. Thus, a portion of the TFT 101 is located at the adjacent pixel. In particular, in this embodiment, a region where the pixel electrode PE and the second extraction electrode 32 are connected to each other, and the first contact hole 41 are located opposite to each other with the gate bus line GL interposed therebetween. Thus, the first contact hole 41 is located in a region of the adjacent pixel. Further, since a portion of the second contact hole 42 is disposed on a portion, of the gate bus line GL, that functions as the gate of the TFT 101, a portion of the pixel electrode PE is also located on the gate bus line GL.

The dielectric 24 covers the pixel electrode PE, and is located on the second insulator 22 and the third insulator 23. The dielectric 24 has insulating properties, and is made of, for example, an inorganic material such as silicon oxide and silicon nitride.

The common electrode 33 is located on the dielectric 24, and covers the entire display region DR of the active matrix substrate 201. The common electrode 33 is made of, for example, a transparent conductor such as ITO.

According to the active matrix substrate 201 of this embodiment, since a portion of the side surface 42s of the second contact hole 42 is not covered with the second extraction electrode 32, occurrence of light leakage at a contact hole during black display is suppressed. Reasons for this will be described in detail below.

Figure 6A:
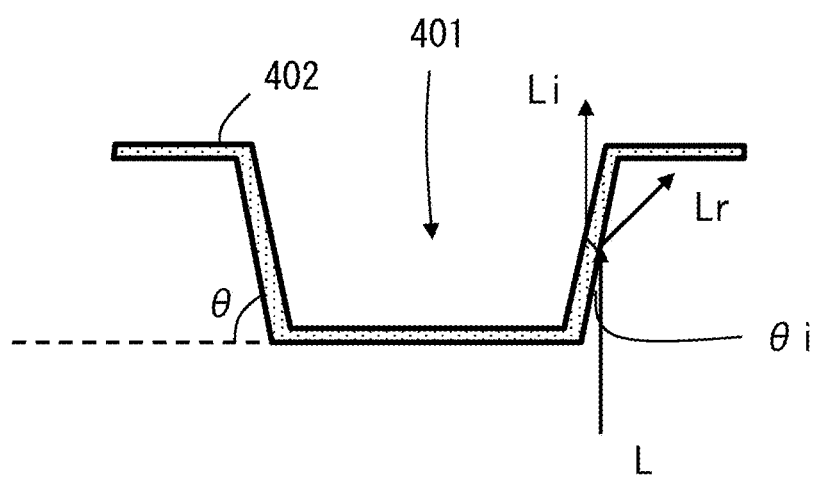
FIG. 6A is a schematic view for describing a state where light L is incident from a backlight, in a state where a transparent extraction electrode is disposed at a contact hole.

As described above, in a case where light is transmitted also through the oxide semiconductor layer of the pixel TFT in order to increase the aperture ratio of the liquid crystal display device, it is conceivable to adopt a structure in which the pixel electrode and the oxide semiconductor layer are connected to each other by a transparent extraction electrode via a contact hole. FIG. 6A is a schematic view for describing a state where light L is incident from a backlight, in a state where a transparent extraction electrode 402 is disposed over an entire side surface of a contact hole 401. The light L from the backlight is incident on the second extraction electrode 32 at a low (small) incident angle θi, at the side surface of the contact hole, a portion of the light L is totally reflected on the side surface to become reflected light Lr, and the remaining light L becomes incident light Li traveling into the contact hole.

Figure 6B:
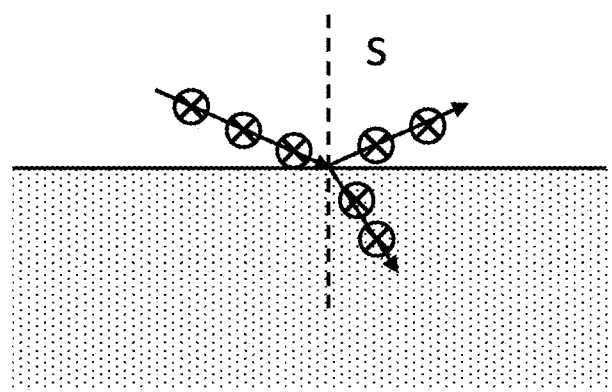
FIG. 6B is a schematic view for describing reflected light and transmitted light in a case where s-polarized light is incident on a boundary surface.
Figure 6C:
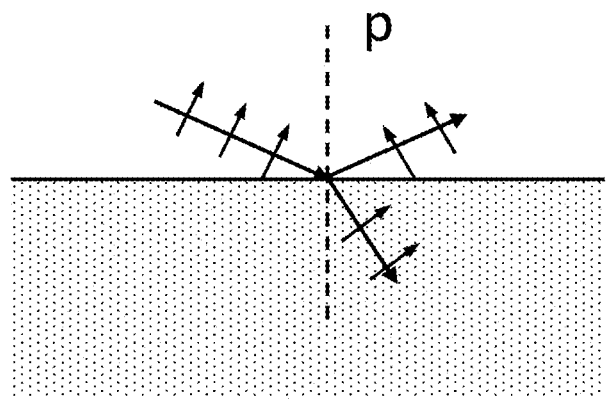
FIG. 6C is a schematic view for describing reflected light and transmitted light in a case where p-polarized light is incident on the boundary surface.

At this time, the transmittance and reflectivity at the side surface of the extraction electrode 402 differ depending on whether the light L is s-polarized light or p-polarized light. As illustrated in FIG. 6B, light having an electric field in a direction parallel to a boundary surface perpendicular to the paper surface of the drawing is the s-polarized light. As illustrated in FIG. 6C, light having an electric field in a direction parallel to a plane including incident light and reflected light is the p-polarized light.

Figure 7:
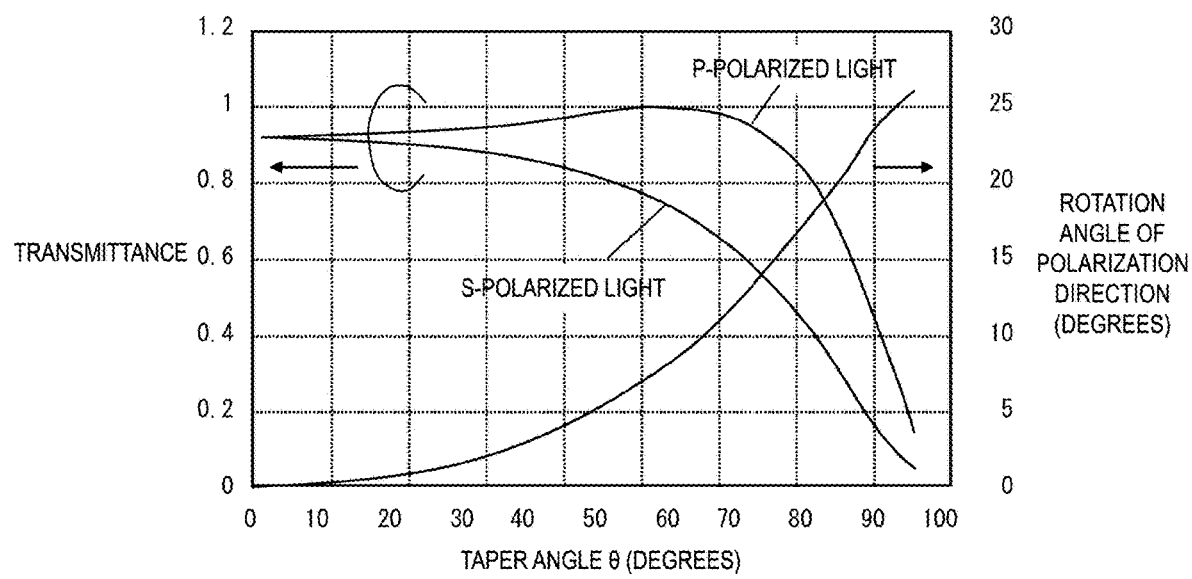
FIG. 7 shows dependence of the transmittances of the s-polarized light and the p-polarized light on a taper angle θ of the contact hole, and the rotation angle of the polarization direction of the transmitted light.

FIG. 7 shows the transmittances of the s-polarized light and the p-polarized light with respect to a taper angle θ of the contact hole. The taper angle θ is defined as an angle formed by the side surface of the contact hole with respect to the horizontal direction, and satisfies a relationship of θ+θi=90°, as illustrated in FIG. 6A. The results shown in FIG. 7 were obtained by performing calculations based on the Fresnel equations assuming that the refractive index of a medium outside the contact hole was 1.45, and the extraction electrode had a thickness of 70 nm and was made of a medium having the refractive index of 2.00. As shown in FIG. 7, when the taper angle θ is 0°, the transmittances of the s-polarized light and the p-polarized light are both about 90%, and the values of the transmittances are equal to each other. The transmittance of the p-polarized light increases until the taper angle θ reaches about 58°, and reaches almost 100%. Thereafter, when the taper angle θ exceeds 58°, the transmittance decreases. When the taper angle θ is 90°, the transmittance is about 0%. On the other hand, the transmittance of the s-polarized light is substantially constant until the taper angle θ is about 15°, and the transmittance decreases after the taper angle θ exceeds 15°. When the taper angle θ is 90°, the transmittance is about 0%.

Figure 8:
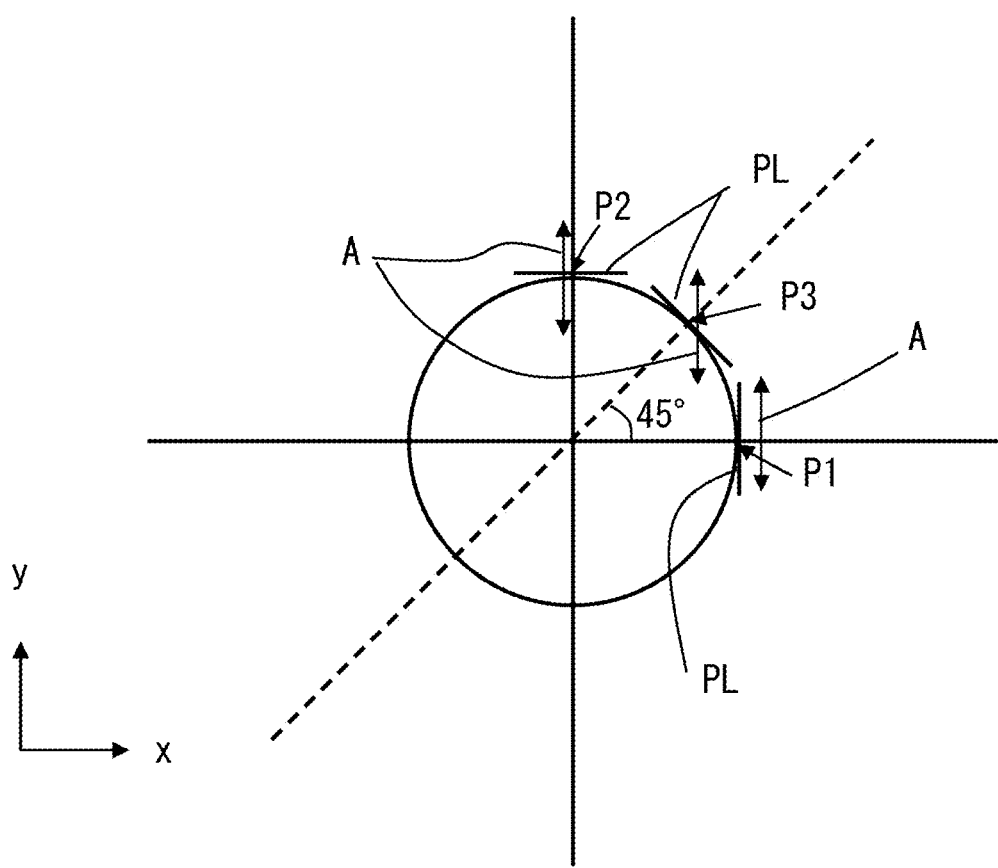
FIG. 8 shows a relationship between an incident boundary surface of the extraction electrode formed at a side surface of the contact hole, and a polarization axis of incident light, in a case where a bottom portion of the contact hole has a circular shape.

FIG. 8 illustrates a relationship between an incident boundary surface PL of the second extraction electrode 32 formed at the side surface of the contact hole, and the polarization axis of incident light, in a case where the opening and the bottom portion of the contact hole each have a circular shape. The incident boundary surface PL is a plane including a chosen generatrix at the side surface of the contact hole. In order to identify the position of the incident boundary surface PL, an x-axis and a y-axis are defined, with the center of the bottom portion (opening) of the contact hole as an origin point in a plan view. The position of the incident boundary surface PL is identified using a counterclockwise angle φ from the x-axis directed in the forward direction.

The incident light has a polarization axis A parallel to the y-axis, as illustrated in FIG. 8, for example, by being transmitted through a polarizer having a transmission axis parallel to the y-axis. In FIG. 8, when light is incident on the second extraction electrode of the second contact hole 42 at a position P1 where φ=0°, the incident boundary surface PL is parallel to the polarization axis of the light. Thus, the incident light includes only an s-polarization component, and does not include a p-polarization component. As a result, even if there is a difference in the transmittance between the s-polarized light and the p-polarized light as shown in FIG. 7, this does not have an impact. In other words, the light transmitted through the second extraction electrode includes only the s-polarization component, and does not include the p-polarization component. The same applies to the polarization components of the incident light and the transmitted light, at the incident boundary surface PL located at a position where φ=180°.

Further, when light is incident on the second extraction electrode 32 of the second contact hole 42 at a position P2 where φ=90°, the incident boundary surface PL is perpendicular to the polarization axis A of the light. Thus, the incident light includes only the p-polarization component, and does not include the s-polarization component. Further, the light transmitted through the extraction electrode includes only the p-polarization component, and does not include the s-polarization component. The same applies to the polarization components of the incident light and the transmitted light, at the incident boundary surface PL located at a position where φ=270°.

On the other hand, when light is incident on the second extraction electrode 32 at the side surface of the contact hole at a position P3 where φ=45°, the incident boundary surface PL forms an angle of 45° with respect to the polarization axis A of the light.

Figure 9:
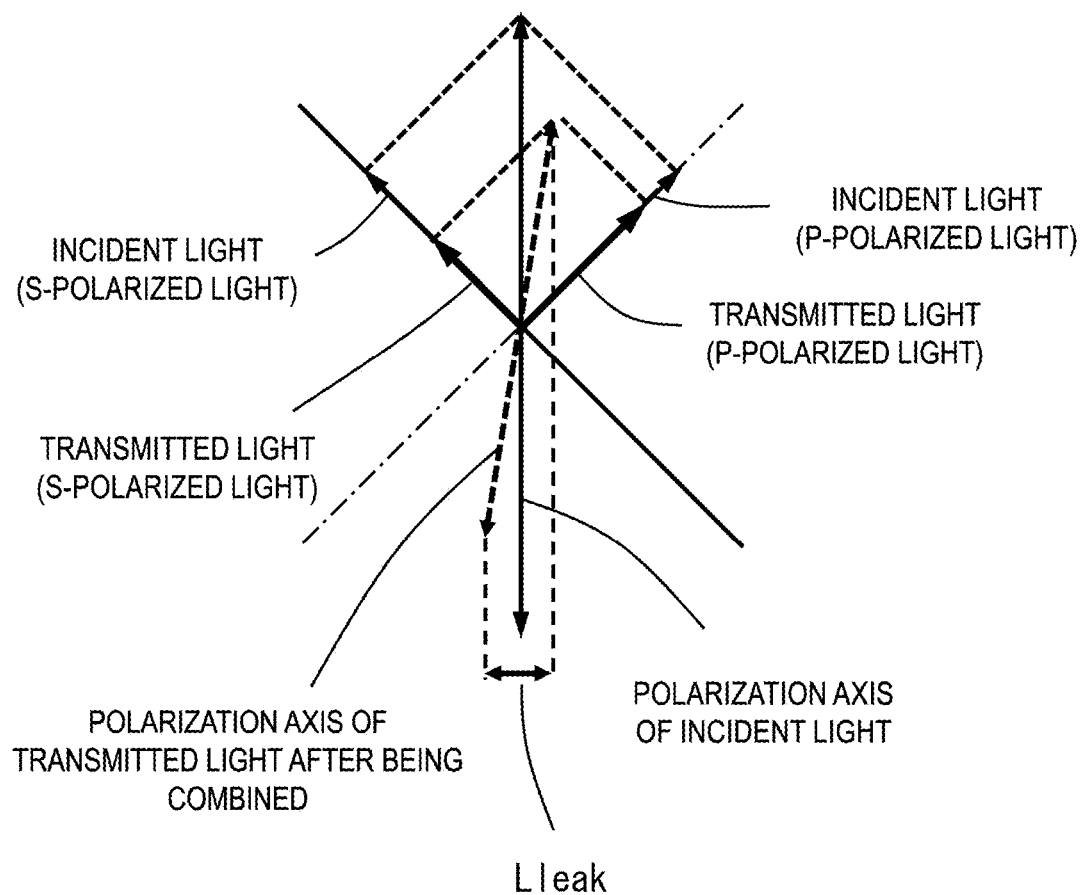
FIG. 9 is a schematic view illustrating the polarization axes of light incident on the contact hole and light transmitted through the contact hole at a position P3.

FIG. 9 is a schematic view for describing the polarization axis of light incident on and transmitted through the contact hole at the position P3. As illustrated in FIG. 9, the incident light includes the p-polarization component and the s-polarization component having the same magnitude. However, as illustrated in FIG. 9, at the incident boundary surface PL, for example, when the taper angle is about 70°, the transmittance of the p-polarization component is larger than the transmittance of the s-polarization component by about 25%. Thus, the p-polarization component in the transmitted light is larger than the s-polarization component by about 25%.

Therefore, the polarization axis of the transmitted light obtained by combining the p-polarization component and the s-polarization component is rotated from the polarization axis of the incident light. Since the polarizer in front of the display device has a transmission axis in a direction orthogonal to the polarization axis of the incident light, the transmitted light has a component of Lleak passing through the transmission axis, as illustrated in FIG. 9. This results in the light leakage during the black display. FIG. 7 shows the relationship between the taper angle θ and the rotation angle of the polarization axis.

The influence from the difference in transmittance between the p-polarization component and the s-polarization component becomes largest at the position where φ=45°, at which the magnitudes of the p-polarization component and the s-polarization component are equal to each other. The same applies to the polarization components of the incident light and the transmitted light, at the incident boundary surface PL located at positions where φ=135°, φ=225°, and φ=315°.

Figure 10:
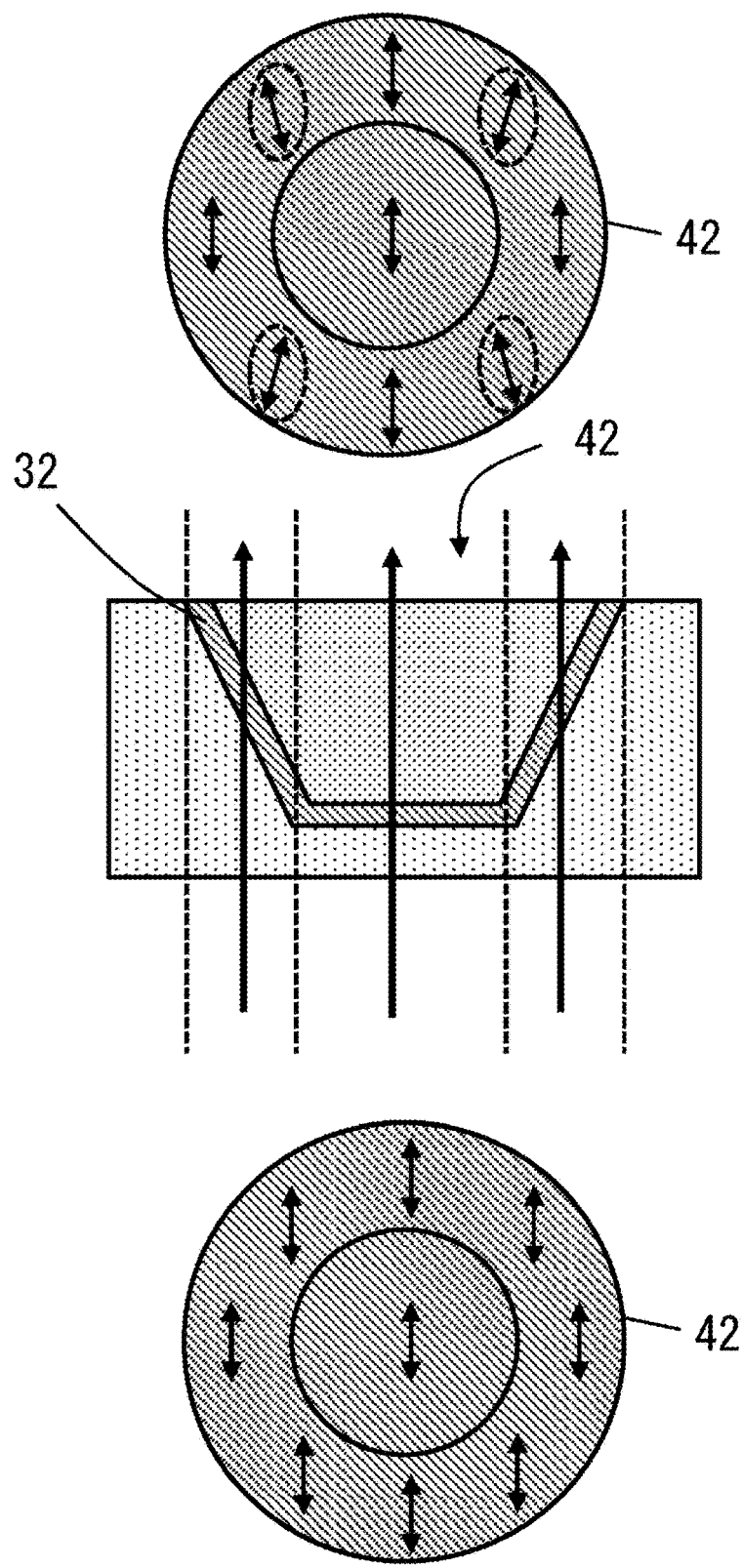
FIG. 10 illustrates a distribution of rotational directions of the polarization axes of the incident light and the transmitted light, in a case where the extraction electrode is formed over the entire side surface of the contact hole.

FIG. 10 illustrates, in the single drawing, a distribution of the directions of the polarization axes of the incident light and the transmitted light at the second contact hole 42, in the case where the second extraction electrode 32 is provided over the entire side surface of the second contact hole 42. As described above, the direction of the polarization axis of the transmitted light is rotated at the positions where φ=45°, 135°, 225°, and 315°, and the light leakage occurs during the black display of the liquid crystal display device.

Since the light incident on the bottom portion 42b of the second contact hole 42 has the taper angle θ=0°, there is no difference in the value of transmittance between the p-polarized light and the s-polarized light, as illustrated in FIG. 7. Thus, the polarization direction of the transmitted light is not rotated at the bottom portion.

In the active matrix substrate 201 of this embodiment, in order to suppress the light leakage at these positions, a portion of the side surface 42s of the second contact hole 42 is not covered with the second extraction electrode 32.

Figure 11:
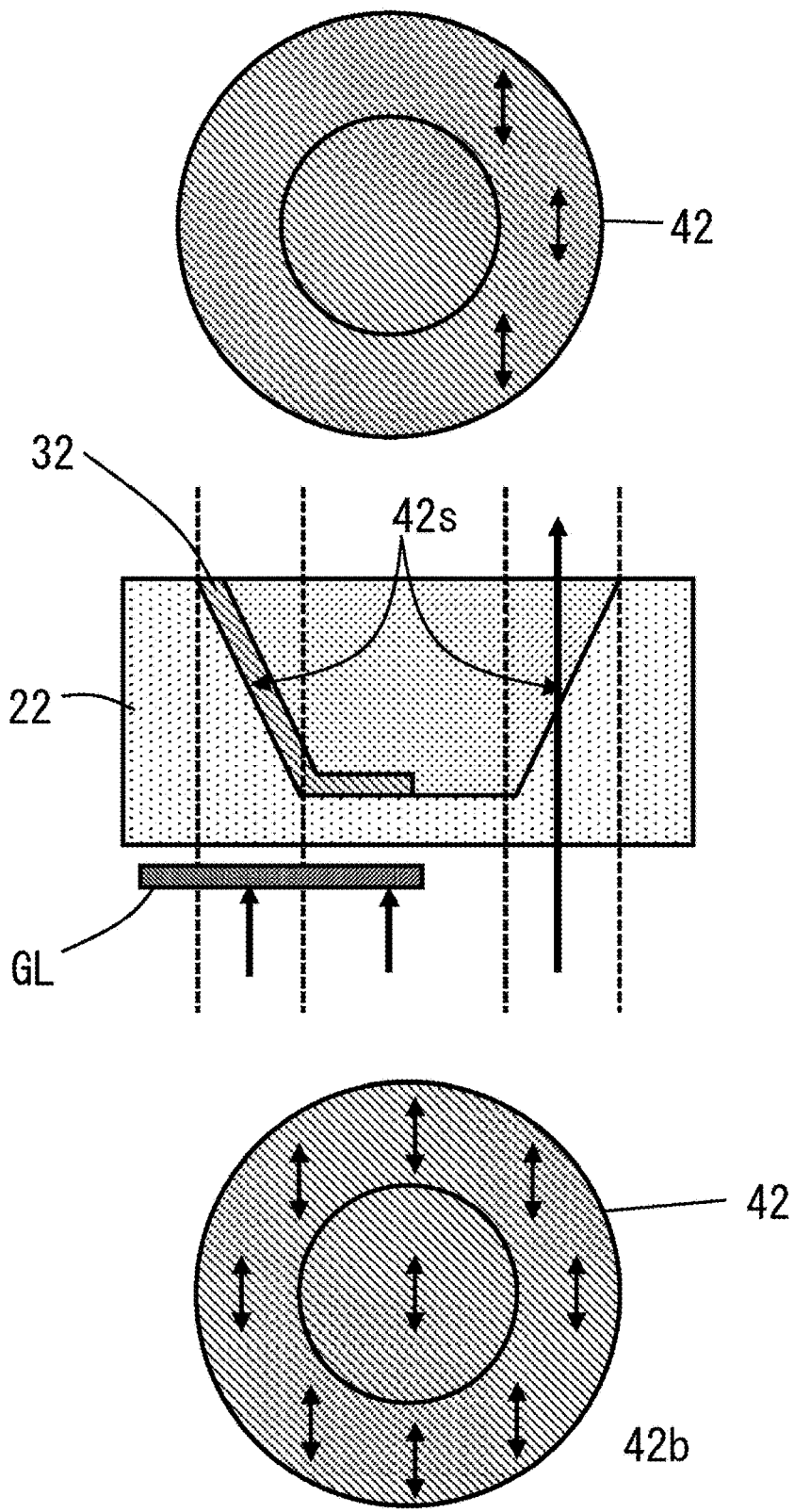
FIG. 11 illustrates an arrangement of a second extraction electrode provided at a side surface of a second contact hole according to the first embodiment, and a distribution of directions of the polarization axes of the incident light and the transmitted light at the second contact hole.

FIG. 11 illustrates, in the single drawing, an arrangement of the second extraction electrode 32 provided at the side surface 42s of the second contact hole 42, and a distribution of the directions of the polarization axes of the incident light and the transmitted light at the second contact hole 42 in this embodiment. As described above with reference to FIG. 4, the second extraction electrode 32 is not located in the region, of the side surface 42s of the second contact hole 42, that does not overlap the gate bus line GL in a plan view. In this region, the side surface 42s of the second contact hole 42 is in contact with the second insulator 22 and the third insulator 23.

The difference in transmittance between the p-polarized light and the s-polarized light is caused by refraction of light. At the second contact hole 42, the difference in transmittance is caused by a large difference in the refractive index between the materials constituting the second insulator 22 and the second extraction electrode 32 in which the second contact hole 42 is formed. Therefore, the above-described light leakage can be suppressed by not providing the second extraction electrode 32 at the second contact hole 42.

Specifically, at the second contact hole 42, the second insulator 22 and the third insulator 23 are in contact with each other in a region where the second extraction electrode 32 is not provided. Therefore, the difference in refractive index is smaller than that in a case where the second insulator 22 is in contact with the second extraction electrode 32, and thus, the light leakage can be suppressed. In particular, when each of the second insulator 22 and the third insulator 23 is an organic insulator, the refractive index is about 1.4 to 1.5 regardless of the type of the insulator, and thus the difference in transmittance between the p-polarized light and the s-polarized light can be reduced. Furthermore, when the second insulator 22 and the third insulator 23 are made of the same resin material, the difference in refractive index between the second insulator 22 and the third insulator 23 is 0, and thus, refraction does not occur at the side surface 42s of the second contact hole 42. As a result, the light leakage can be further suppressed.

In particular, the second insulator 22 at which the second contact hole 42 is provided functions as a flattening film, and has a relatively large thickness compared to the other insulating layers. Thus, the area of the side surface 42s of the second contact hole 42 is also relatively large, and thus, the area where the light leakage may occur also becomes large. Therefore, the effect of suppressing the light leakage by the above-described configuration is significant.

On the other hand, at the second contact hole 42, a region where the second extraction electrode 32 is provided overlaps the gate bus line GL (and the light blocking layer 11) in a plan view, and light is blocked from entering the second contact hole 42 from the substrate 10 side. Therefore, the light leakage at the side surface 42s of the second contact hole 42 is also suppressed. Since the gate bus line GL is utilized to block the light and it is thus not necessary to enlarge a region to be blocked, a drop in the aperture ratio can also be suppressed.

The active matrix substrate 201 according to this embodiment can be manufactured by the same method as a generic active matrix substrate. It is sufficient that a transparent conductive film made of ITO or the like be formed, and patterning be performed on the transparent conductive film so that the second extraction electrode 32 has the above-described structure.

According to the active matrix substrate 201 and the liquid crystal display device 301 of this embodiment, since the pixel TFT includes the oxide semiconductor layer, and the pixel electrode and the oxide semiconductor layer are connected to each other by the transparent extraction electrode via the contact hole, a high aperture ratio can be realized. Further, by not covering a portion of the side surface of the second contact hole with the second extraction electrode, the light leakage during the black display can be suppressed.

Second Embodiment

Figure 12:
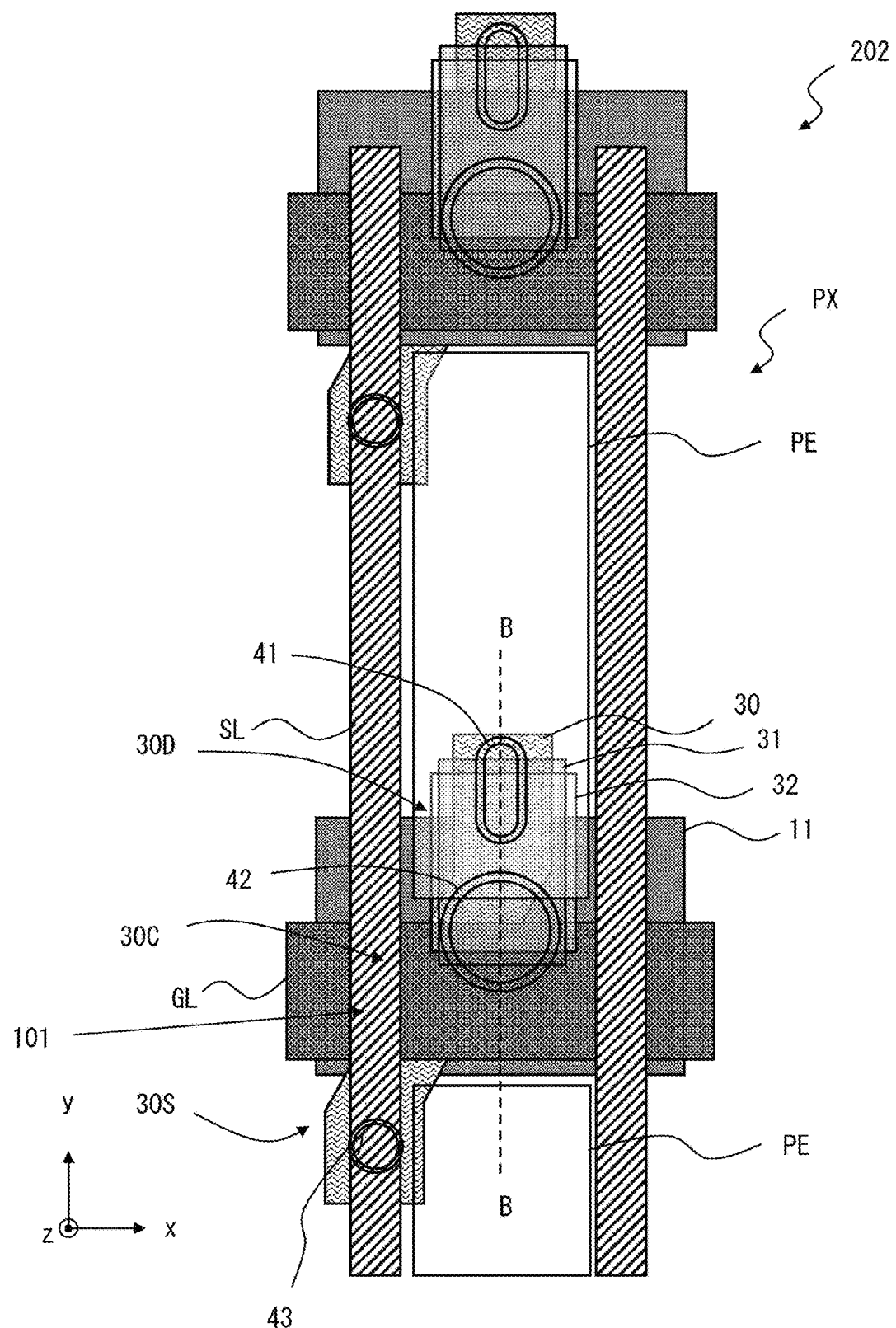
FIG. 12 is a plan view illustrating a structure of each of pixels of an active matrix substrate according to a second embodiment.
Figure 13:
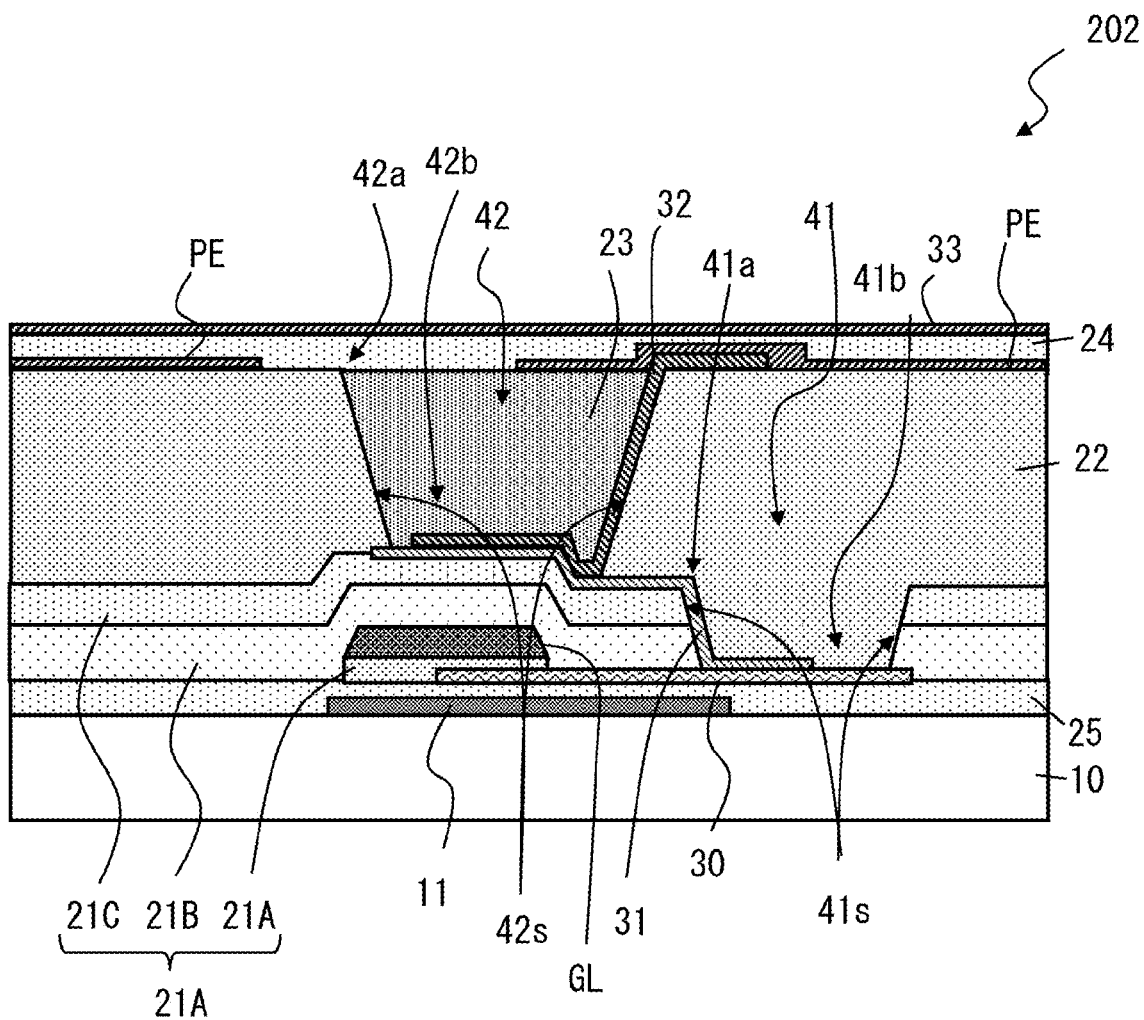
FIG. 13 is a schematic view illustrating a structure of the active matrix substrate at a cross section taken along a line B-B in FIG. 12.

FIG. 12 is a plan view illustrating main constituent elements of the pixel PX of an active matrix substrate 202 of this embodiment, and FIG. 13 illustrates a structure of the active matrix substrate 202 at a cross section taken along a line B-B in FIG. 12. As in the first embodiment, in FIG. 12, in order to clearly illustrate how the constituent elements overlap one another, some of the constituent elements are illustrated so that the underlying structure thereof is visible, and the common electrode and various insulating layers are not illustrated.

One of the features of the active matrix substrate 202 and a liquid crystal display device provided with the active matrix substrate 202 is that, at the first contact hole 41, a portion of the side surface 41s is not covered with the first extraction electrode 31.

In this embodiment, the first contact hole 41 has an oval or elliptical shape extending in the y direction. Further, the light blocking layer 11 has a larger width in the y direction than that of the gate bus line GL, and extends toward the first contact hole 41 side. The entire second contact hole 42 overlaps the light blocking layer 11 in a plan view. In a mode illustrated in FIG. 12, the width of the light blocking layer 11 in the y direction is the same at any position in the x direction, but, for example, the width of a portion not overlapping the first extraction electrode 31 may be substantially the same as that of the gate bus line GL in a plan view.

The first extraction electrode 31 is located on the first insulator 21 and in at least a portion of the first contact hole 41, and is connected to the oxide semiconductor layer 30 in the first contact hole 41. The first extraction electrode 31 covers only a portion of the side surface 41s of the first contact hole 41, and does not cover the remaining portion of the side surface 41s. More specifically, the first extraction electrode 31 is located at a portion, of the side surface 41s of the first contact hole 41, overlapping the light blocking layer 11 in a plan view, and the first extraction electrode 31 is not located at a portion, of the side surfaces 41s, not overlapping the light blocking layer 11.

The second extraction electrode 32 is located on the second insulator 22 and in at least a portion of the second contact hole 42, and is connected to the first extraction electrode 31 in the second contact hole 42. Further, the second extraction electrode 32 is located on the second insulator 22 on the first contact hole 41 side. A portion of the pixel electrode PE overlaps the second extraction electrode 32 on the second insulator 22. Thus, in this embodiment, the pixel electrode PE is disposed on the pixel at which the first contact hole is located. Further, the source of the TFT 101 is located at an adjacent pixel.

In a mode illustrated in FIG. 12 and FIG. 13, the second extraction electrode 32 does not cover a region, of the side surface 42s of the second contact hole 42, that is located on the adjacent pixel side. However, the entire side surface 42s of the second contact hole 42 may be covered with the second extraction electrode 32.

According to the active matrix substrate 202 and the liquid crystal display device of this embodiment, a portion of the side surface 41s of the first contact hole 41 is not covered with the first extraction electrode 31. Thus, similarly to the second contact hole 42 in the first embodiment, the light leakage during the black display can be suppressed. Further, a region, of the side surface 41s of the first contact hole 41, that is covered with the first extraction electrode 31 overlaps the light blocking layer 11 in a plan view, and light incident from the substrate 10 is blocked by the light blocking layer 11. Therefore, in the entire first contact hole 41, the light leakage during the black display can be suppressed. Further, the entire second contact hole 42 overlaps the light blocking layer 11 in a plan view, and the light incident from the substrate 10 is blocked by the light blocking layer 11. Therefore, in the entire second contact hole 42, the light leakage during the black display can be suppressed.

Further, since the first contact hole 41 has the oval or elliptical shape extending in the y direction, it is possible to increase a region, of the side surface 41s, including the positions where φ=90° and 270°, without significantly increasing the region, of the side surface 41s, including the positions where φ=45°, 135°, 225°, and 315°, which may cause the light leakage during the black display. Thus, at the side surface 41s, it is possible to suppress an increase in the size of the region that is provided for suppressing the light leakage and in which the first extraction electrode 31 is not provided, and to suppress the resistance from increasing due to the narrowing of the width of the first extraction electrode 31. Further, as described in the first embodiment, since the light leakage is suppressed in the region including the positions where φ=90° and 270°, this region of the side surface 41s may not be covered with the light blocking layer 11. As a result, it is possible to suppress an increase in the size of a region to be covered with the light blocking layer 11, and to suppress the aperture ratio from significantly dropping as a result of the area of the light blocking layer 11 being increased.

Third Embodiment

Figure 14:
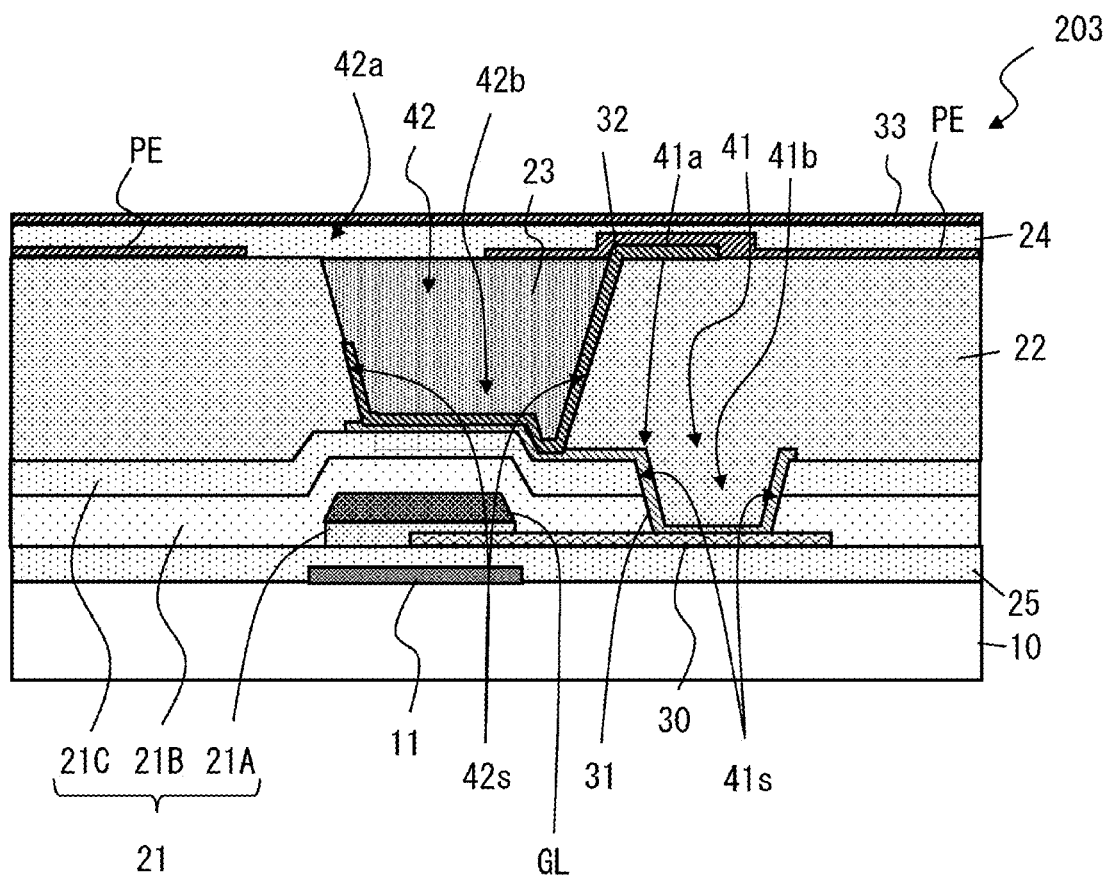
FIG. 14 is a schematic view illustrating a cross-sectional structure of an active matrix substrate according to a third embodiment.

FIG. 14 illustrates a cross-sectional structure of an active matrix substrate 203 according to this embodiment. The active matrix substrate 203 according to this embodiment differs from the active matrix substrate 201 of the first embodiment in that the entire side surface 42s of the second contact hole 42 is covered with the second extraction electrodes 32, and the refractive index of the second insulator 22 and the third insulator 23, and the taper angle of the second contact hole 42 satisfy a predetermined relationship. Further, the pixel electrode PE overlaps the second extraction electrode 32 on the first contact hole 41 side with respect to the gate bus line GL.

Figure 15:
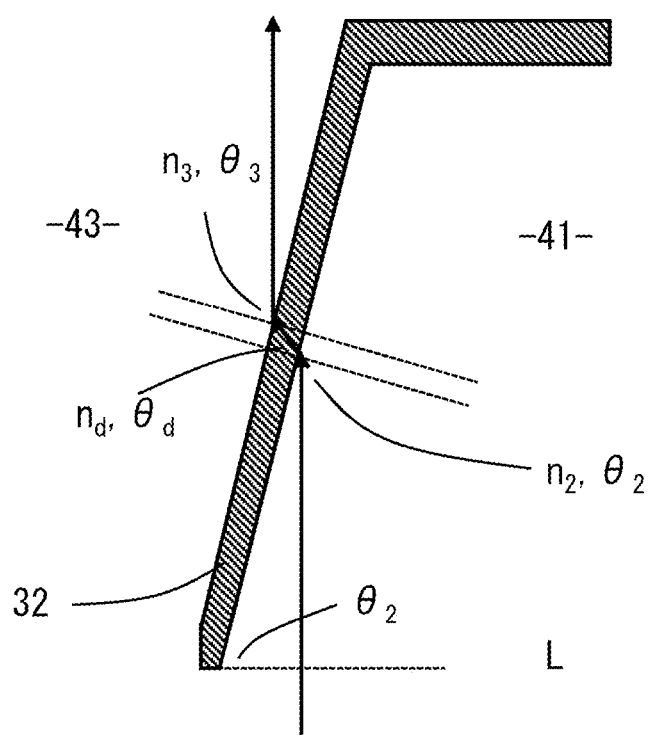
FIG. 15 is a schematic view for describing light transmitted through a second contact hole in the third embodiment.

As illustrated in FIG. 15, the incident angle of light incident on the second extraction electrode 32 from the second insulator 22 with respect to a straight line perpendicular to the side surface 42s is denoted by $\theta_2$, the emission angle from the second insulator 22 to the second extraction electrode 32 is denoted by Od, and the emission angle from the second extraction electrode 32 to the third insulator 23 is denoted by $\theta_3$. Further, the refractive index of the second insulator 22, the second extraction electrode 32, and the third insulator 23 are denoted by $n_2$, $n_d$, and $n_3$, respectively. Based on Snell's law, $n_2 \times \sin \theta_2 = n_4 \times \sin \theta_d = n_3 \times \sin \theta_3$ is satisfied.

Focusing on the second insulator 22 and the third insulator 23, when $\theta_2$ is a critical angle, light is not incident on the third insulator 23, and travels through the interface between the second extraction electrode 32 and the third insulator 23 ($\theta_3$=90°). In other words, a condition under which the light incident from the substrate 10 side is totally reflected at the side surface 42s of the second contact hole 42 is expressed by the following Inequality (1).

$$n_2 \times \sin \theta_2 > n_3 \qquad (1)$$

By satisfying the relationship of Inequality (1), transmission of the light through the second contact hole 42 is suppressed, even when the second extraction electrode 32 is located at the side surface 42s.

The refractive indices of the second insulator 22 and the third insulator 23 can be adjusted by selecting the materials constituting the second insulator 22 and the third insulator 23, for example, by selecting transparent resin materials. The taper angle of the side surface 42s of the second contact hole 42 can be controlled by appropriately setting the etching conditions when forming the second contact hole 42. Specifically, the taper angle $\theta_2$ can be controlled by controlling the ratio (aspect ratio) between the etching rate in the depth direction (thickness direction) and the etching rate in the lateral direction when etching the second insulator 22 at which the second contact hole 42 is formed. More specifically, the taper angle $\theta_2$ can be controlled by adjusting the material of the second insulator 22, the type and combination of etching gases ($COF_2$, $CF_4$, $CHF_3$, $H_2$, $O_2$, Ar, and the like) used for etching, the combination ratio and flow rate ratio of the gases, the pressure during etching, the discharge power, and the like.

According to this embodiment, since the taper angle of the second contact hole 42 and the refractive indices of the second insulator 22 and the third insulator 23 satisfy the relationship of Inequality (1), the light leakage during the black display can be suppressed.

Fourth Embodiment

Figure 16:
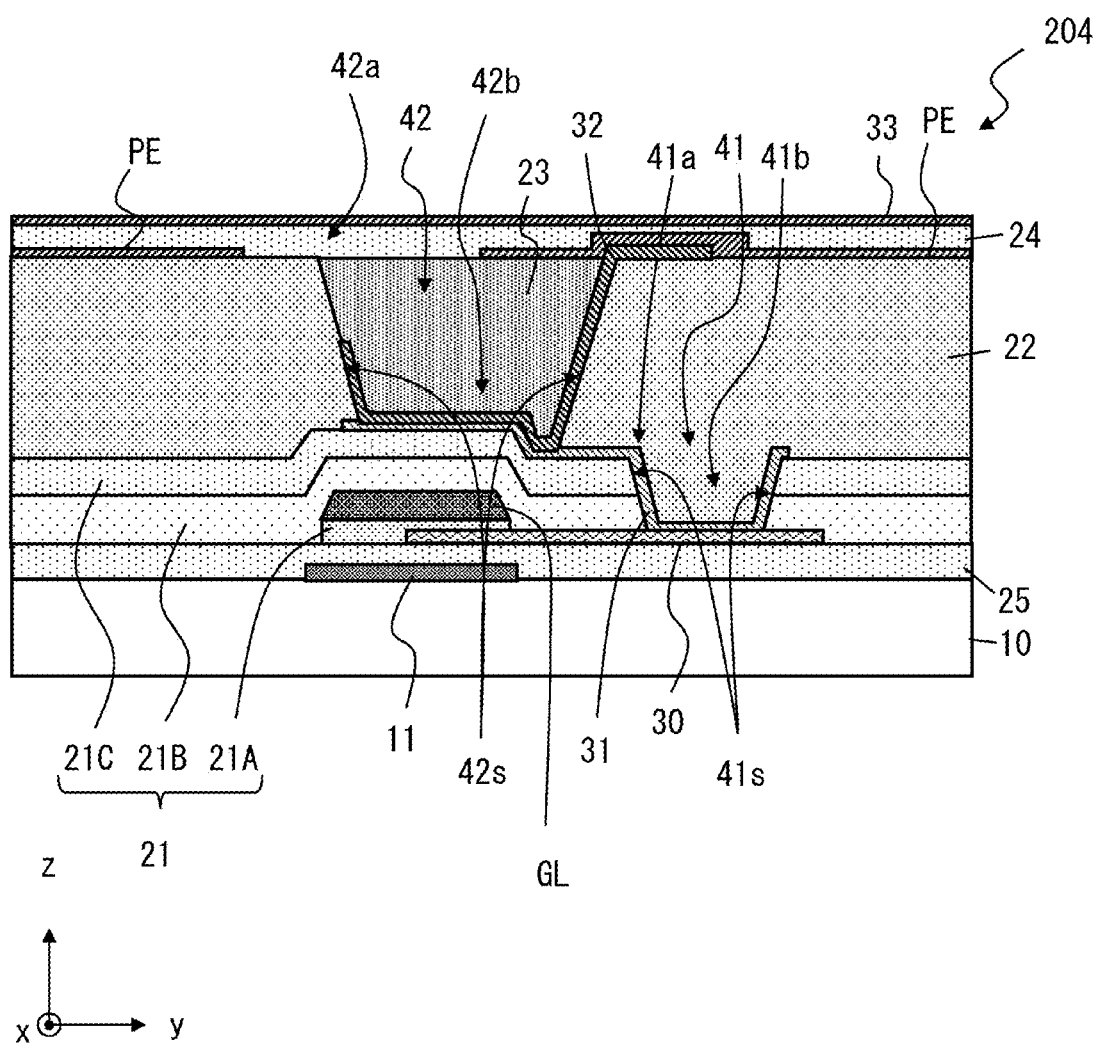
FIG. 16 is a schematic view illustrating a cross-sectional structure of an active matrix substrate according to a fourth embodiment.

FIG. 16 illustrates a cross-sectional structure of an active matrix substrate 204 according to this embodiment. The active matrix substrate 204 of this embodiment differs from the active matrix substrate 203 of the third embodiment in that the entire side surface 41s of the first contact hole 41 is covered with the first extraction electrode 31, and the refractive indices of the first insulator 21 and the third insulator 23 and the taper angle of the second contact hole 42 satisfy a predetermined relationship.

It is assumed that the gate insulating layer 21A, the first inorganic insulating layer 21B, and the second inorganic insulating layer 21C included in the first insulator 21 are made of, for example, the same material, thus, all have the same refraction index $n_1$, and the taper angle of the first contact hole 41 is $\theta_1$. In this case, as described in the third embodiment, if the following Inequality (2) is satisfied with respect to the refraction index $n_2$ of the second insulator 22, the light incident from the substrate 10 side is totally reflected at the side surface 41s of the first contact hole 41.

$$n_1 \times \sin \theta_1 > n_2 \qquad (2)$$

Alternatively, the gate insulating layer 21A, the first inorganic insulating layer 21B, and the second inorganic insulating layer 21C may have different refractive indices of $n_{1A}$, $n_{1B}$, and $n_{1C}$, respectively, and may satisfy $$n_{1A} \times \sin \theta_1 > n_2 \qquad (2A),$$

$$n_{1B} \times \sin \theta_1 > n_2 \qquad (2B), \text{ and}$$

$$n_{1C} \times \sin \theta_1 > n_2 \qquad (2C),$$

respectively. By satisfying the relationship expressed by Inequality (2) or Inequalities (2A) to (2C), the light leakage during the black display can be suppressed.

Further, when at least one of the relationships expressed by Inequalities (2A) to (2C) is satisfied, total reflection is suppressed in a layer having a refractive index satisfying the condition. Thus, the light leakage during the black display can be suppressed in at least a portion of the region of the side surface 41s of the first contact hole 41. The total thickness of the layers satisfying the conditions expressed by Inequalities (2A) to (2C) is preferably half or more of the total thickness of the first insulator 21. As a result, the light leakage during the black display can be suppressed in half or more of the region of the side surface 41s of the first contact hole 41.

Fifth Embodiment

Figure 17:
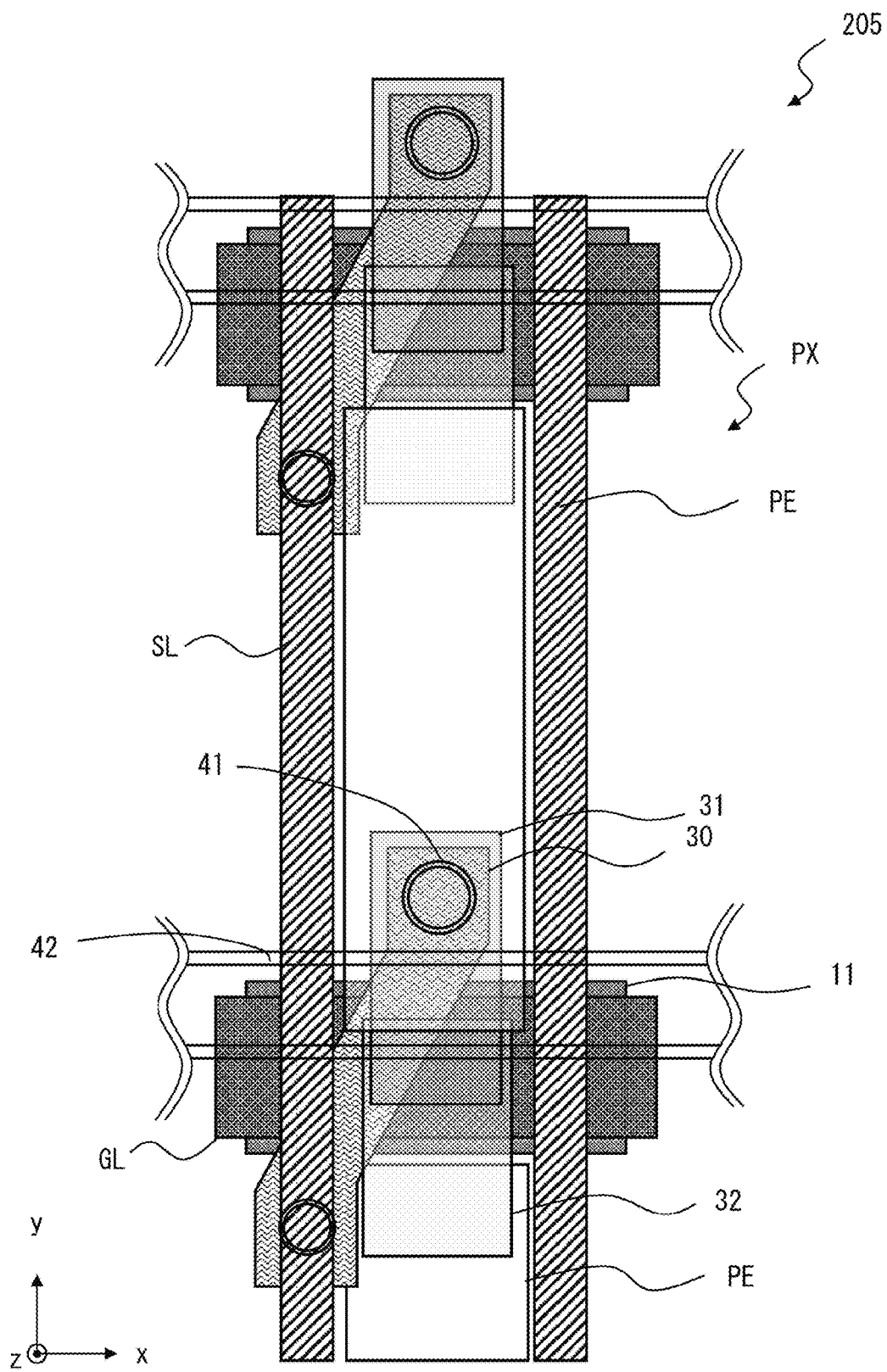
FIG. 17 is a plan view illustrating a structure of each of pixels of an active matrix substrate according to a fifth embodiment.

FIG. 17 is a plan view illustrating main constituent elements of the pixel PX of an active matrix substrate 205 according to this embodiment.

The active matrix substrate 205 according to this embodiment differs from the active matrix substrate 201 of the first embodiment in that the second contact hole 42 has a groove shape in a plan view, and the second extraction electrode 32 covers the side surface 42s.

Specifically, the second contact hole 42 according to this embodiment has a groove shape extending in parallel to the x direction and continuous with the second contact hole 42 of the adjacent pixel. The second extraction electrode 32 covers the side surface 42s and the bottom portion 42b of the groove-shaped second contact hole 42, over the entire width along the x-direction in a plan view. Since the second extraction electrode 32 is separated from the second extraction electrode 32 of the adjacent pixel in a plan view, there is a region where the second extraction electrode 32 is not provided, at the side surface 42s and the bottom portion 42b of the groove-shaped second contact hole 42 extending in the x direction.

Since the side surface 42s of the groove-shaped second contact hole 42 is parallel to the x direction, the side surface 42s corresponds to the case where the incident boundary surface PL is located at the position where $\varphi=0°$ or $180°$, as described above with reference to FIG. 8, and the polarization axis of the light transmitted through the side surface 42s is not rotated. Therefore, according to the active matrix substrate 205 of this embodiment, the light leakage during the black display can be suppressed.

Sixth Embodiment

Figure 18:
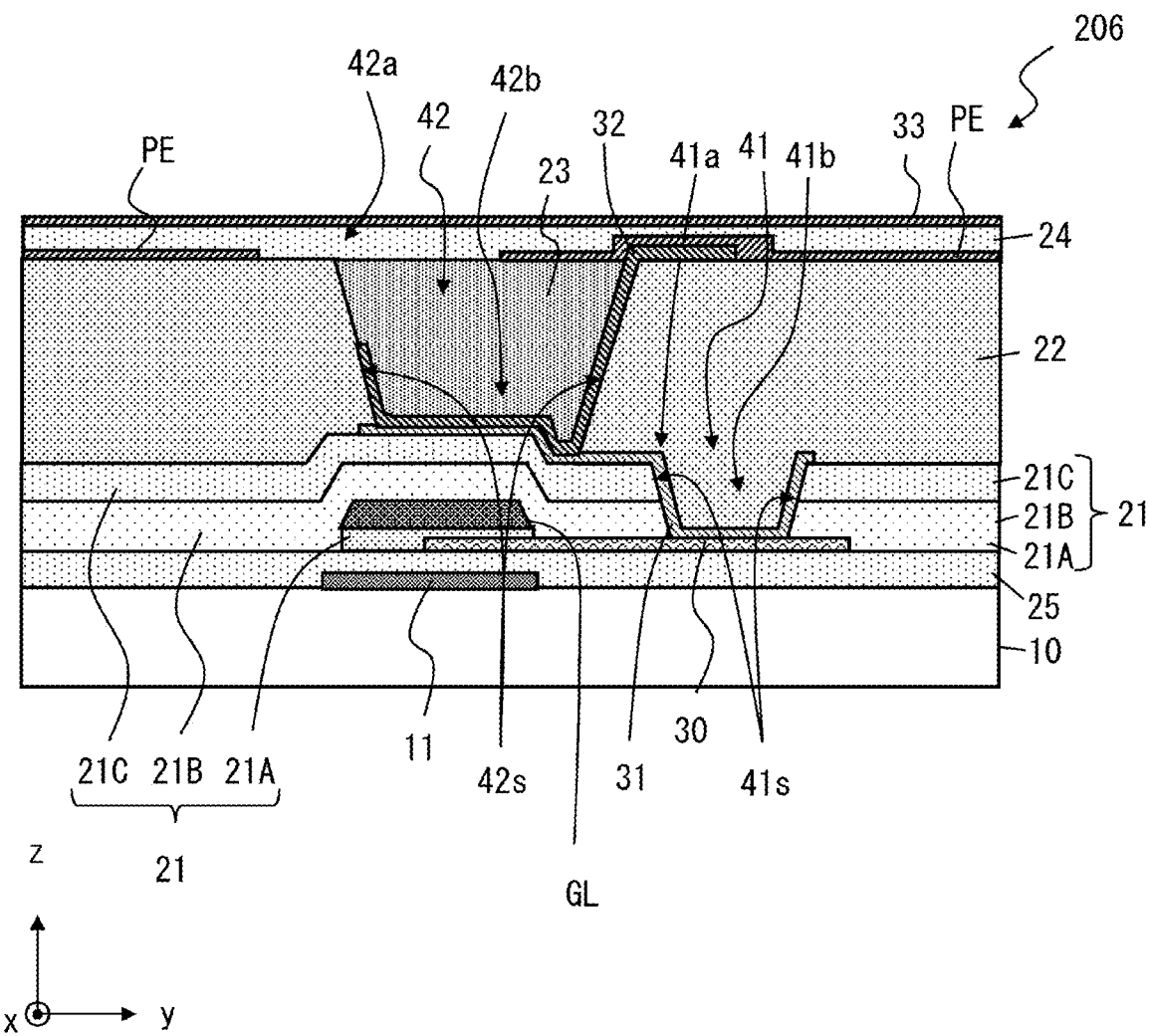
FIG. 18 is a schematic view illustrating a cross-sectional structure of an active matrix substrate according to a sixth embodiment.

FIG. 18 illustrates a cross-sectional structure of an active matrix substrate 206 according to this embodiment. The active matrix substrate 206 according to this embodiment differs from the active matrix substrate 203 of the third embodiment in that at least one of the first extraction electrode 31 and the second extraction electrode 32 has a predetermined thickness at the side surface of the second contact hole.

Light incident on the side surface 42s of the second contact hole 42 from the substrate 10 side at the active matrix substrate 206 can be refracted and reflected at the interface between the second insulator 22 and the second extraction electrode 32 and the interface between the second extraction electrode 32 and the third insulator 23. When a thickness d of the second extraction electrode 32 located at the side surface 42s of the second contact hole 42 satisfies a predetermined condition with respect to a wavelength λ of the transmitted light, specifically, when phases are shifted from each other by half the wavelength, light transmitted through to the third insulator 23 side can be reduced as a result of attenuation between the light that is transmitted through the second extraction electrode 32 and that travels toward the third insulator 23, and the light that is reflected at the interface between the second extraction electrode 32 and the third insulator 23 and that returns to the second insulator 22 side. This condition is expressed by the following Equations (3) and (4).

$$d = \lambda/(2 \times n_d \times \cos \theta_d) \qquad (3)$$

$$\theta_d = \sin^{-1}(n_2 \times \sin \theta_2/n_d) \qquad (4)$$

Here, each of the symbols is as illustrated in FIG. 15. Specifically, $n_2$ is the refractive index of the second insulator 22, and $\theta_2$ is the incident angle from the second insulator 22 to the second extraction electrode 32. $\theta_2$ is also the taper angle of the second contact hole 42. Further, $n_d$ is the refractive index of the second extraction electrode 32, and $\theta d$ is the emission angle from the second insulator 22 to the second extraction electrode 32.

Figure 19:
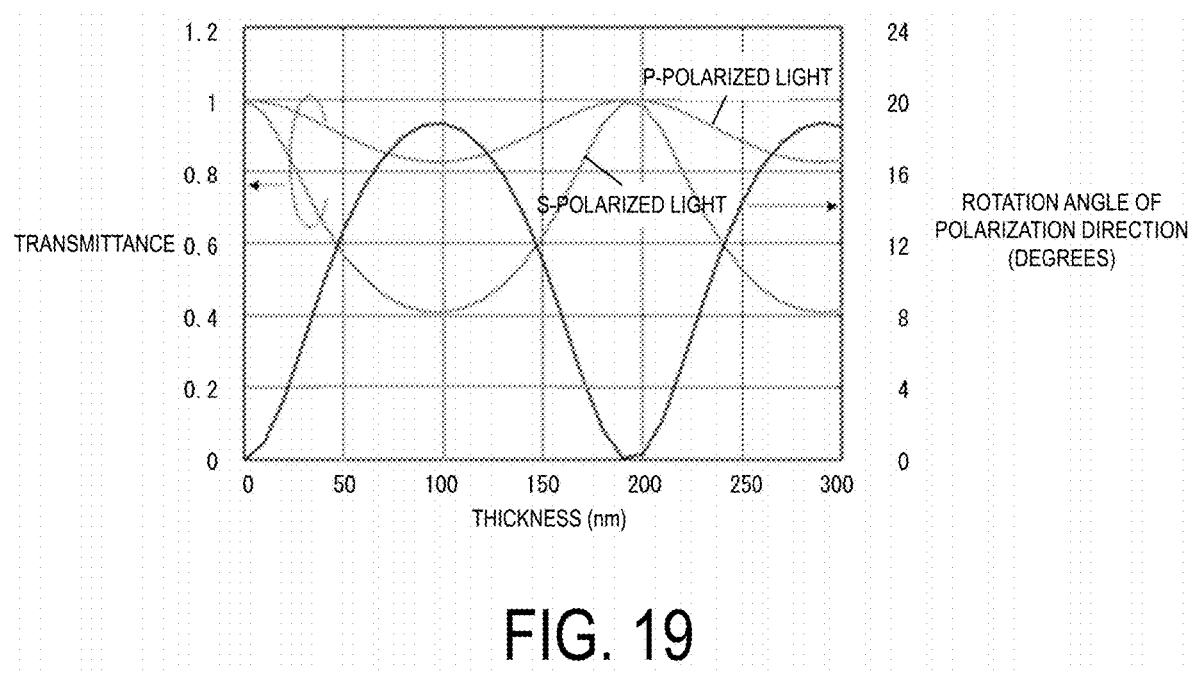
FIG. 19 shows a relationship between a thickness d and the transmittances of the p-polarized light and the s-polarized light, and a relationship between the thickness d and the rotation angle of the polarization direction of the transmitted light, in a case where green light is transmitted through the second extraction electrode having the thickness d.

FIG. 19 shows a relationship between the thickness d of the second extraction electrode 32 and the transmittances of a p-wave and an s-wave, and a relationship between the thickness d of the second extraction electrode 32 and the rotation angle of the polarization direction of the transmitted light, in a case where $n_2=n_3=1.5$, $n_d=2.0$, and $\theta_2=700$ and green light having the wavelength of 550 nm is used. As shown in FIG. 19, it can be understood that when the thickness d of the second extraction electrode 32 is about 194 nm, the rotation angle of the polarization direction is substantially 0 and the polarization direction of the transmitted light is hardly rotated. When λ=550 nm is substituted into Equations (3) and (4), d is 194 nm.

Figure 20:
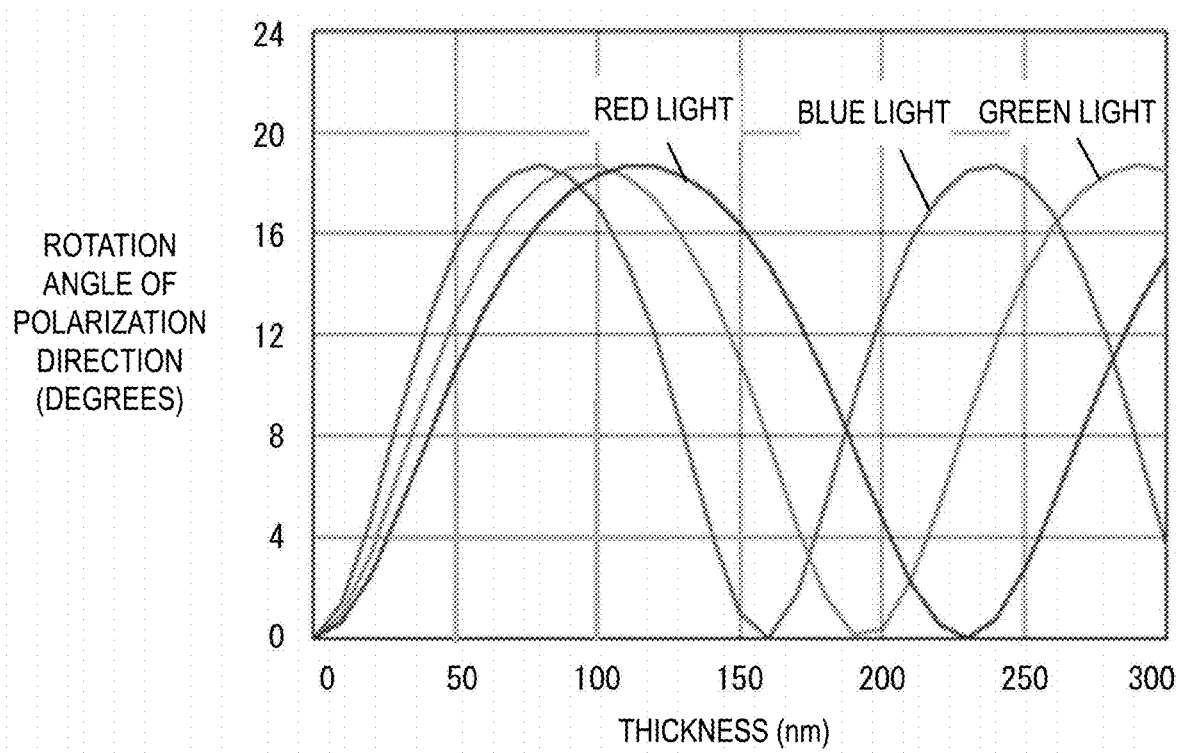
FIG. 20 shows the relationship between the thickness d and the rotation angle of the polarization direction of the transmitted light, in a case where red light, blue light, and the green light are transmitted through the second extraction electrode having the thickness d.

FIG. 20 shows a relationship between the thickness d of the second extraction electrode 32 and the rotation angle of the polarization direction of the transmitted light, in a case where blue light with the wavelength of 450 nm and red light with the wavelength of 650 nm are used. FIG. 20 also shows the results for the green light. Due to the difference in wavelength, the thickness d where the rotation angle of the polarization direction becomes substantially 0 for the green light differs from the thickness d where the rotation angle of the polarization direction becomes substantially 0 for the blue light and the red light. However, around the thickness of 195 nm where the rotation angle of the polarization direction is substantially 0 with respect to the green light, the rotation angles of the polarization directions of the blue light and the red light are also relatively small, which is about 8°.

Since green has the highest visibility among the three primary colors, when the thickness d is selected that causes the rotation angle of the polarization direction to be small with respect to the green light, it is conceivable that the effect of suppressing the light leakage will be sufficiently recognized, even if the rotation angles of the polarization directions of the blue light and the red light do not become small to the same extent. For example, as shown in FIG. 19 and FIG. 20, when the thickness d of the second extraction electrode 32 is within a range of about 175 nm to about 215 nm, the rotation angle of the polarization direction of the green light is about 4° or less, and the rotation angles of the polarization directions of the blue light and the red light are about 120 or less. More preferably, the thickness d of the second extraction electrode 32 is set to be from 180 nm to 210 nm.

Further, many resin materials and inorganic insulators each have the refractive index of about 1.5. On the other hand, the refractive index of a transparent conductor such as ITO is about 2.0. Therefore, according to this embodiment, it can be understood that the light leakage during the black display can be suppressed by setting the thickness d of the second extraction electrode 32 to be in the range of about 175 nm to about 215 nm.

Although the thickness of the second extraction electrode 32 at the second contact hole 42 has been described above, the thickness of the first extraction electrode 31 at the first contact hole 41 can also be set in the above-described range. Specifically, the thickness of the first extraction electrode 31 may be from 175 nm and to 215 nm, or from 180 nm to 210 nm. Further, the thicknesses of both the first extraction electrode 31 and the second extraction electrode 32 may be set to be from 175 nm and to 215 nm, or from 180 nm to 210 nm. As a result, the light leakage during the black display can be suppressed at the first contact hole 41 as well as at the second contact hole 42.

OTHER EMBODIMENTS

The above-described embodiments may be combined with each other in an appropriate manner. For example, the first embodiment and the second embodiment may be combined. In this case, the light blocking layer 11 may be divided into a portion covering the gate bus line GL and a portion of the second contact hole 42, and a portion covering the first contact hole 41. Further, the third embodiment and the fourth embodiment may be combined, or the fourth embodiment and the fifth embodiment may be combined.

Further, the structure of the active matrix substrate described in each of the above-described embodiments is merely an example, and the structure of the active matrix substrate of the disclosure is not limited to the structures described in those embodiments. Specifically, the position and structure of the pixel TFT are not limited to those of the embodiments disclosed herein, and the thickness and material of the insulator are not limited to those of the embodiments disclosed herein.

The active matrix substrate and the liquid crystal display device according to the disclosure can also be described as follows.

An active matrix substrate according to a first configuration includes a substrate including a display region, a plurality of source bus lines extending in a first direction at the display region, a plurality of gate bus lines extending in a second direction intersecting the first direction, and a plurality of pixels located on the display region of the substrate, each of the plurality of pixels being electrically connected to one of the plurality of source bus lines and one of the plurality of gate bus lines. Each of the plurality of pixels includes an oxide semiconductor layer located on the substrate and partially overlapping the one of the plurality of gate bus lines in a plan view, a first insulator covering the oxide semiconductor layer, a first contact hole located at the first insulator and configured to expose a portion of the oxide semiconductor layer, a first extraction electrode located on the first insulator and in at least a portion of the first contact hole, and connected to the oxide semiconductor layer, a second insulator covering the first extraction electrode, a second contact hole located at the second insulator and configured to expose a portion of the first extraction electrode, a second extraction electrode located on the second insulator and in at least a portion of the second contact hole, and connected to the first extraction electrode, and a pixel electrode located on the second insulator and connected to the second extraction electrode. The first extraction electrode and the second extraction electrode are light-transmissive, and a portion of a side surface of at least one of the first contact hole and the second contact hole is not covered with the first extraction electrode and the second extraction electrode.

According to the active matrix substrate of the first configuration, since a portion of the side surface of at least one of the first contact hole and the second contact hole is not covered with the first extraction electrode and the second extraction electrode, rotation of the polarization direction of light transmitted through the contact hole is suppressed, and light leakage during black display is suppressed.

In a second configuration, in the first configuration, each of the plurality of pixels may be located on the substrate, and further includes a light blocking layer overlapping the one of the plurality of gate bus lines in a plan view, the second extraction electrode may cover only a portion of the side surface of the second contact hole, and a portion, of the second extraction electrode, covering the side surface may overlap the one of the plurality of gate bus lines in a plan view, and a portion, of the side surface of the second contact hole, not covered by the second extraction electrode may not overlap the light blocking layer in a plan view. As a result, the light leakage during the black display is suppressed at the second contact hole.

In a third configuration, in the first configuration, each of the plurality of pixels may be located on the substrate, and further includes a light blocking layer overlapping at least the one of the plurality of gate bus lines in a plan view, the first extraction electrode may cover only a portion of the side surface of the first contact hole, the light blocking layer may overlap a portion, of the first extraction electrode, covering the side surface in a plan view, and a portion, of the side surface of the first contact hole, not covered by the first extraction electrode may not overlap the light blocking layer in a plan view. As a result, the light leakage during the black display is suppressed at the first contact hole.

An active matrix substrate according to a fourth configuration includes a substrate including a display region, a plurality of source bus lines extending in a first direction at the display region, a plurality of gate bus lines extending in a second direction intersecting the first direction, and a plurality of pixels located on the display region of the substrate, each of the plurality of pixels being electrically connected to one of the plurality of source bus lines and one of the plurality of gate bus lines. Each of the plurality of pixels includes an oxide semiconductor layer located on the substrate and partially overlapping the one of the plurality of gate bus lines in a plan view, a first insulator covering the oxide semiconductor layer, a first contact hole located at the first insulator and configured to expose a portion of the oxide semiconductor layer, a first extraction electrode located on the first insulator and in at least a portion of the first contact hole, and connected to the oxide semiconductor layer, a second insulator covering the first extraction electrode and located in the first contact hole and on the first insulator, a second contact hole located at the second insulator and configured to expose a portion of the first extraction electrode, a second extraction electrode located on the second insulator and in at least a portion of the second contact hole, and connected to the first extraction electrode, a third insulator located in the second contact hole, and a pixel electrode located on the second insulator and connected to the second extraction electrode. The first extraction electrode and the second extraction electrode are light-transmissive, and at least one of Inequalities (1) and (2) described below $$n_1 \times \sin\theta_1 > n_2 \quad (1)$$

$$n_2 \times \sin\theta_2 > n_3 \quad (2)$$

is satisfied when a refractive index of the first insulator, a refractive index of the second insulator, and a refractive index of the third insulator are $n_1$, $n_2$, and $n_3$, respectively, and an angle formed between a side surface of the first contact hole and a main surface of the substrate, and an angle formed between a side surface of the second contact hole and the main surface of the substrate are $\theta_1$ and $\theta_2$, respectively.

According to the active matrix substrate of the fourth configuration, as a result of the refractive indices of the first insulator, the second insulator, and the third insulator satisfying the above-described condition, the rotation of the polarization direction of the light transmitted through the contact hole is suppressed, and the light leakage during the black display is suppressed.

In a fifth configuration, in the fourth configuration, a relationship of the Inequality (1) may satisfied, the first insulator may include a first inorganic insulating layer and a second inorganic insulating layer, a refractive index of the first inorganic insulating layer may be greater than a refractive index of the second inorganic insulating layer, the first inorganic insulating layer may have the refractive index of $n_1$, and a thickness of the first inorganic insulating layer may greater than a thickness of the second inorganic insulating layer. As a result, at the first inorganic insulating layer of the first contact hole, the rotation of the polarization direction of the light transmitted through the contact hole is suppressed, and the light leakage during the black display is suppressed.

An active matrix substrate according to a sixth configuration includes a substrate including a display region, a plurality of source bus lines extending in a first direction at the display region, a plurality of gate bus lines extending in a second direction orthogonal to the first direction, and a plurality of pixels located on the display region of the substrate, each of the plurality of pixels being electrically connected to one of the plurality of source bus lines and one of the plurality of gate bus lines. Each of the plurality of pixels includes an oxide semiconductor layer located on the substrate and partially overlapping the one of the plurality of gate bus lines in a plan view, a first insulator covering the oxide semiconductor layer, a first contact hole located at the first insulator and configured to expose a portion of the oxide semiconductor layer, a first extraction electrode located on the first insulator and in at least a portion of the first contact hole, and connected to the oxide semiconductor layer, a second insulator covering the first extraction electrode, a second contact hole located at the second insulator and configured to expose a portion of the first extraction electrode, a second extraction electrode located on the second insulator and in at least a portion of the second contact hole, and connected to the first extraction electrode, and a pixel electrode located on the second insulator and connected to the second extraction electrode. The first extraction electrode and the second extraction electrode are light-transmissive, and the second contact hole extends in parallel to the second direction, and has a groove shape continuous with the second contact hole of an adjacent pixel.

According to the active matrix substrate of the sixth configuration, since the second contact hole has the above-described shape, light leakage during the black display is suppressed.

An active matrix substrate according to a seventh configuration includes a substrate including a display region, a plurality of source bus lines extending in a first direction at the display region, a plurality of gate bus lines extending in a second direction orthogonal to the first direction, and a plurality of pixels located on the display region of the substrate, each of the plurality of pixels being electrically connected to one of the plurality of source bus lines and one of the plurality of gate bus lines. Each of the plurality of pixels includes an oxide semiconductor layer located on the substrate and partially overlapping the one of the plurality of gate bus lines in a plan view, a first insulator covering the oxide semiconductor layer, a first contact hole located at the first insulator and configured to expose a portion of the oxide semiconductor layer, a first extraction electrode located on the first insulator and in at least a portion of the first contact hole, and connected to the oxide semiconductor layer, a second insulator covering the first extraction electrode, a second contact hole located at the second insulator and configured to expose a portion of the first extraction electrode, a second extraction electrode located on the second insulator and in at least a portion of the second contact hole, and connected to the first extraction electrode, and a pixel electrode located on the second insulator and connected to the second extraction electrode. The first extraction electrode and the second extraction electrode are light-transmissive, and at least one of a thickness $d_1$ of the first extraction electrode at a side surface of the first contact hole and a thickness $d_2$ of the second extraction electrode at a side surface of the second contact hole is set to be from 175 nm to 215 nm.

According to the active matrix substrate of the seventh configuration, since at least one of the first extraction electrode and the second extraction electrode has the above-described thickness, the light leakage during the black display is suppressed.

In an eighth configuration, in any one of the first to fifth and seventh configurations, a shape of a bottom portion of the second contact hole may be a circular shape.

In a ninth configuration, any one of the first to eighth configurations may further include a drive circuit configured to drive the plurality of pixels, the drive circuit may be disposed at a non-display region located around the display region of the substrate, and the drive circuit may include a plurality of thin film transistors each including a polycrystalline silicone semiconductor layer.

A liquid crystal display device according to a tenth configuration includes the active matrix substrate according to any one of the first to ninth configurations, a counter substrate facing the active matrix substrate, a liquid crystal layer located between the active matrix substrate and the counter substrate, and a pair of polarizers facing each other with at least the liquid crystal layer interposed between the pair of polarizers. The pair of polarizers are disposed in a crossed-Nicol manner, and polarization axes of the pair of polarizers are parallel or perpendicular to the first direction. According to the liquid crystal display device of the tenth configuration, since the active matrix substrate has the above-described configuration, the light leakage during the black display is suppressed, and high-contrast display can be performed.

INDUSTRIAL APPLICABILITY

An active matrix substrate according to an embodiment of the disclosure is suitably used in a liquid crystal display device such as a liquid crystal display device for a head-mounted display, a smartphone, or the like. Further, the active matrix substrate according to the embodiment of the disclosure is also suitably used for various display devices, such as an organic EL display device, as well as for the liquid crystal display device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a substrate including a display region;
a plurality of source bus lines extending in a first direction at the display region;
a plurality of gate bus lines extending in a second direction intersecting the first direction; and
a plurality of pixels located on the display region of the substrate, each of the plurality of pixels being electrically connected to one of the plurality of source bus lines and one of the plurality of gate bus lines,
wherein each of the plurality of pixels includes
an oxide semiconductor layer located on the substrate and partially overlapping the one of the plurality of gate bus lines in a plan view,
a first insulator covering the oxide semiconductor layer,
a first contact hole located at the first insulator and configured to expose a portion of the oxide semiconductor layer,
a first extraction electrode located on the first insulator and in at least a portion of the first contact hole, and connected to the oxide semiconductor layer,
a second insulator covering the first extraction electrode,
a second contact hole located at the second insulator and configured to expose a portion of the first extraction electrode,
a second extraction electrode located on the second insulator and in at least a portion of the second contact hole, and connected to the first extraction electrode, and
a pixel electrode located on the second insulator and connected to the second extraction electrode,
the first extraction electrode and the second extraction electrode are light-transmissive, and
a portion of a side surface of at least one of the first contact hole and the second contact hole is not covered with the first extraction electrode and the second extraction electrode.

2. The active matrix substrate according to claim 1, wherein each of the plurality of pixels is located on the substrate, and further includes a light blocking layer overlapping the one of the plurality of gate bus lines in a plan view,
the second extraction electrode covers only a portion of the side surface of the second contact hole, and
a portion, of the second extraction electrode, covering the side surface overlaps the one of the plurality of gate bus lines in a plan view, and a portion, of the side surface of the second contact hole, not covered by the second extraction electrode does not overlap the light blocking layer in a plan view.

3. The active matrix substrate according to claim 1, wherein each of the plurality of pixels is located on the substrate, and further includes a light blocking layer overlapping at least the one of the plurality of gate bus lines in a plan view,
the first extraction electrode covers only a portion of the side surface of the first contact hole, and
the light blocking layer overlaps a portion, of the first extraction electrode, covering the side surface in a plan view, and a portion, of the side surface of the first contact hole, not covered by the first extraction electrode does not overlap the light blocking layer in a plan view.

4. The active matrix substrate according to claim 1, wherein a shape of a bottom portion of the second contact hole is a circular shape.

5. The active matrix substrate according to claim 1, further comprising
a drive circuit configured to drive the plurality of pixels,
wherein the drive circuit is disposed at a non-display region located around the display region of the substrate, and
the drive circuit includes a plurality of thin film transistors each including a polycrystalline silicone semiconductor layer.

6. A liquid crystal display device comprising:
the active matrix substrate according to claim 1;
a counter substrate facing the active matrix substrate;
a liquid crystal layer located between the active matrix substrate and the counter substrate; and
a pair of polarizers facing each other with at least the liquid crystal layer interposed between the pair of polarizers,
wherein the pair of polarizers are disposed in a crossed-Nicol manner, and
polarization axes of the pair of polarizers are parallel or perpendicular to the first direction.

7. An active matrix substrate comprising:
a substrate including a display region;
a plurality of source bus lines extending in a first direction at the display region;
a plurality of gate bus lines extending in a second direction intersecting the first direction; and
a plurality of pixels located on the display region of the substrate, each of the plurality of pixels being electrically connected to one of the plurality of source bus lines and one of the plurality of gate bus lines,
wherein each of the plurality of pixels includes
an oxide semiconductor layer located on the substrate and partially overlapping the one of the plurality of gate bus lines in a plan view,
a first insulator covering the oxide semiconductor layer,
a first contact hole located at the first insulator and configured to expose a portion of the oxide semiconductor layer,
a first extraction electrode located on the first insulator and in at least a portion of the first contact hole, and connected to the oxide semiconductor layer,
a second insulator covering the first extraction electrode and located in the first contact hole and on the first insulator,
a second contact hole located at the second insulator and configured to expose a portion of the first extraction electrode,
a second extraction electrode located on the second insulator and in at least a portion of the second contact hole, and connected to the first extraction electrode,
a third insulator located in the second contact hole, and
a pixel electrode located on the second insulator and connected to the second extraction electrode,
the first extraction electrode and the second extraction electrode are light-transmissive, and
at least one of Inequalities (1) and (2) described below $$n_1 \times \sin \theta_1 > n_2 \quad (1)$$

$$n_2 \times \sin \theta_2 > n_3 \quad (2)$$

is satisfied when a refractive index of the first insulator, a refractive index of the second insulator, and a refractive index of the third insulator are $n_1$, $n_2$, and $n_3$, respectively, and an angle formed between a side surface of the first contact hole and a main surface of the substrate, and an angle formed between a side surface of the second contact hole and the main surface of the substrate are $\theta_1$ and $\theta_2$, respectively.

8. The active matrix substrate according to claim 7,
wherein a relationship of the Inequality (1) is satisfied,
the first insulator includes a first inorganic insulating layer and a second inorganic insulating layer,
a refractive index of the first inorganic insulating layer is greater than a refractive index of the second inorganic insulating layer,
the first inorganic insulating layer has the refractive index of $n_1$, and
a thickness of the first inorganic insulating layer is greater than a thickness of the second inorganic insulating layer.

9. An active matrix substrate comprising:
a substrate including a display region;
a plurality of source bus lines extending in a first direction at the display region;
a plurality of gate bus lines extending in a second direction orthogonal to the first direction; and
a plurality of pixels located on the display region of the substrate, each of the plurality of pixels being electrically connected to one of the plurality of source bus lines and one of the plurality of gate bus lines,
wherein each of the plurality of pixels includes
an oxide semiconductor layer located on the substrate and partially overlapping the one of the plurality of gate bus lines in a plan view,
a first insulator covering the oxide semiconductor layer,
a first contact hole located at the first insulator and configured to expose a portion of the oxide semiconductor layer,
a first extraction electrode located on the first insulator and in at least a portion of the first contact hole, and connected to the oxide semiconductor layer,
a second insulator covering the first extraction electrode,
a second contact hole located at the second insulator and configured to expose a portion of the first extraction electrode,
a second extraction electrode located on the second insulator and in at least a portion of the second contact hole, and connected to the first extraction electrode, and
a pixel electrode located on the second insulator and connected to the second extraction electrode,
the first extraction electrode and the second extraction electrode are light-transmissive, and
the second contact hole extends in parallel to the second direction, and has a groove shape continuous with the second contact hole of an adjacent pixel.

10. An active matrix substrate comprising:
a substrate including a display region;
a plurality of source bus lines extending in a first direction at the display region;
a plurality of gate bus lines extending in a second direction orthogonal to the first direction; and
a plurality of pixels located on the display region of the substrate, each of the plurality of pixels being electrically connected to one of the plurality of source bus lines and one of the plurality of gate bus lines,
wherein each of the plurality of pixels includes
an oxide semiconductor layer located on the substrate and partially overlapping the one of the plurality of gate bus lines in a plan view,
a first insulator covering the oxide semiconductor layer,
a first contact hole located at the first insulator and configured to expose a portion of the oxide semiconductor layer,
a first extraction electrode located on the first insulator and in at least a portion of the first contact hole, and connected to the oxide semiconductor layer,
a second insulator covering the first extraction electrode,
a second contact hole located at the second insulator and configured to expose a portion of the first extraction electrode, a second extraction electrode located on the second insulator and in at least a portion of the second contact hole, and connected to the first extraction electrode, and
a pixel electrode located on the second insulator and connected to the second extraction electrode,
the first extraction electrode and the second extraction electrode are light-transmissive, and
at least one of a thickness $d_1$ of the first extraction electrode at a side surface of the first contact hole and a thickness $d_2$ of the second extraction electrode at a side surface of the second contact hole is set to be from 175 nm to 215 nm.

* * * * *